(12) United States Patent
Igarashi

(10) Patent No.: US 8,796,782 B2
(45) Date of Patent: Aug. 5, 2014

(54) SEMICONDUCTOR DEVICE AND METHOD OF MANUFACTURING THE SAME

(75) Inventor: Takayuki Igarashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/554,560

(22) Filed: Jul. 20, 2012

(65) Prior Publication Data

US 2013/0043542 A1     Feb. 21, 2013

(30) Foreign Application Priority Data

Aug. 15, 2011    (JP) ................. 2011-177404

(51) Int. Cl.
*H01L 29/76*     (2006.01)
*H01L 29/94*     (2006.01)

(52) U.S. Cl.
USPC ........... 257/380; 257/379; 438/200; 438/210; 438/239

(58) Field of Classification Search
USPC .................... 257/379–380, E27.06, E21.409; 438/200, 210, 239
See application file for complete search history.

(56) References Cited

U.S. PATENT DOCUMENTS

2004/0026762 A1*   2/2004   Hirano et al. ................. 257/536
2007/0096183 A1*   5/2007   Ogawa et al. ................ 257/300

FOREIGN PATENT DOCUMENTS

JP    2002-176109    6/2002
JP    2008-124061    5/2008

* cited by examiner

*Primary Examiner* — Theresa T Doan
(74) *Attorney, Agent, or Firm* — McDermott Will & Emery LLP

(57) ABSTRACT

A polysilicon film that serves as a resistance element is formed. The polysilicon film is patterned to a predetermined shape. CVD oxide films covering the patterned polysilicon film are etched thereby removing the portion of the CVD oxide film where the contact region is formed, leaving the portion covering the portion of the polysilicon film that serves as the resistor main body. $BF_2$ is implanted by using the portions of the remaining CVD oxide films covering the polysilicon film as an implantation mask thereby forming a high concentration region in the contact region.

5 Claims, 30 Drawing Sheets

SEMICONDUCTOR DEVICE AND METHOD OF MANUFACTURING THE SAME

CROSS REFERENCE TO RELATED APPLICATIONS

The disclosure of Japanese Patent Application No. 2011-177404 filed on Aug. 15, 2011 including the specification, drawings and abstract is incorporated herein in reference in its entirety.

BACKGROUND

The present invention concerns a semiconductor device and a method of manufacturing the same and it particularly relates to a semiconductor device having a polysilicon resistor and a field effect transistor, as well as a manufacturing method thereof.

A CMOS (Complementary Metal Oxide Semiconductor) field effect transistor having a PMOS field effect transistor and an NMOS field effect transistor as the field effect transistor of relatively low consumption power is used frequently as an active element together with a resistor element in a semiconductor device. In the semiconductor device of this type, the CMOS field effect transistor is formed in an element forming region defined by an element isolation insulating film in the main surface of a semiconductor substrate. On the other hand, the resistance element is formed over the element isolation insulating film.

A polysilicon resistor is formed as a resistance element. The polysilicon resistor is formed as described below. At first, a polysilicon film is formed over the semiconductor substrate and thereby setting the polysilicon film to a desired resistance value by implanting an impurity at a predetermined concentration into the polysilicon film. Then, the polysilicon film is patterned into a predetermined shape as a resistance element. Then, a contact region containing a high concentration region to which an interconnect, etc. are connected electrically is formed by implanting an impurity having a concentration higher than a predetermined concentration in a predetermined region of the polysilicon film patterned into a predetermined shape is formed. Thus, a polysilicon resistor is formed.

The step of implanting the impurity into the polysilicon film is performed simultaneously with a step of implanting an impurity for forming a source/drain regions of the PMOS field effect transistor or simultaneously with a step of implanting an impurity for forming the source/drain regions of the NMOS field effect transistor.

The CMOS field effect transistor formed in the element forming region and the polysilicon resistor formed over the element isolation insulating film are covered by an interlayer insulating film. Contact holes for exposing a contact region of the polysilicon resistor and contact holes for exposing the respective source/drain regions of the CMOS field effect transistor are formed in the interlayer insulating film. Plugs are formed in each of the contact holes.

Predetermined interconnects are formed over the interlayer insulating film and a polysilicon resistor, or a PMOS field effect transistor or an NMOS field effect transistor is connected electrically by way of the plugs. Examples of literatures disclosing such a semiconductor device having the polysilicon resistor and the field effect transistor include Japanese Unexamined Patent Publication Nos. 2002-176109 and 2008-124061.

SUMMARY

The semiconductor device described above involves the following problems. When the high concentration region is formed by implanting the impurity into the polysilicon film, a portion of the polysilicon film that serves as a resistor main body is covered by a predetermined implantation mask. However, an impurity at a relatively high concentration may sometimes be implanted through the implantation mask into a portion of the polysilicon film that serves as the resistor main body. A predetermined amount of the impurity has been already implanted into the polysilicon film so as to provide a predetermined resistance value. Therefore, an impurity at a relatively high concentration is implanted additionally to a portion of the polysilicon film that serves as the resistor main body and it is considered that the resistance value of the resistance element may vary.

The present invention has been achieved for solving such a problem and it intends to provide a semiconductor device capable of suppressing variation of the resistance value of the resistance element and another object thereof is to provide a method of manufacturing such a semiconductor device.

According to a first aspect of the present invention, a semiconductor device includes, in one aspect, an element isolation insulating film, an element forming region, a field effect transistor, a resistance element, and a shielding film. The element isolation insulating film is formed in a predetermined region over a main surface of a semiconductor substrate. The element forming region is defined by the element isolation insulating film. The field effect transistor is formed in the element forming region and includes a pair of source/drain regions and a gate electrode. The resistance element is situated over the element isolation insulating film, formed of a polysilicon film and has a resistor main body having a predetermined impurity concentration and a contact region. The shielding film includes a first insulating film covering at least the resistor main body and a second insulating film formed over the first insulating film. The first insulating film of the shielding film has a first portion positioned on the lateral side of the polysilicon film of the resistance element and a second portion extending from the lateral side in a direction apart from the lateral side along the upper surface of the element isolation insulating film. The second insulating film of the shielding film is situated so as to cover the first portion and the second portion of the first insulating film. The field effect transistor includes a lateral wall insulating film formed of a layer identical with that of the second insulating film on the side wall of the gate electrode.

According to a second aspect of the present invention, a method of manufacturing a semiconductor device includes the following steps. An element forming region is defined by forming an element isolation insulating film in a predetermined region over the main surface of a semiconductor substrate. A polysilicon film that serves as a resistance element is formed so as to cover the element isolation insulating film. A first impurity having an impurity concentration is implanted into the polysilicon film so as to provide a predetermined resistance value as a resistance element. The polysilicon film is patterned into a predetermined shape as the resistance element. A first insulating film is formed so as to cover the polysilicon film patterned into a predetermined shape. The first insulating film is removed at portions other than a portion situated above the upper surface of the polysilicon film to a portion situated on the lateral side of the polysilicon film, and a portion extending in the direction apart from the lateral side along the upper surface of the element isolation insulating film is removed. A gate electrode is formed in the element forming region. A second insulating film is formed so as to cover the first insulating film and the gate electrode. A first resist pattern is formed over the second insulating film in the form of covering a portion of the polysilicon film that serves as a resistor main body. The second insulating film and the first insulating film are etched using the first resist pattern as a mask thereby exposing a portion of the polysilicon film where the contact region of the resistance element is to be formed while leaving the portion of the first insulating film and the second insulating film covering the resistance main body, and a lateral wall insulating film is formed on the lateral wall of the gate electrode. A second impurity of a predetermined conduction type having an impurity concentration higher than the impurity concentration of the first impurity is implanted using at least the portion of the first insulating film and the second insulating film covering the resistor body as a first implantation mask and using the gate electrode and the lateral wall insulating film as a second insulation mask thereby forming a high concentration region as a contact region in the exposed portion of the polysilicon film, and a pair of source/drain regions are formed in the element forming region with the gate electrode put between them.

In the semiconductor device according to the first aspect of the present invention, variation of the resistance value of the resistor main body having a predetermined impurity concentration is suppressed by the shielding film.

In the method of manufacturing the semiconductor device according to the second aspect of the present invention, penetration of ion implantation into the portion of the polysilicon film that serves as the resistance main body is suppressed by the first implantation mask and variation of the resistance value of the resistor main body is suppressed.

DETAILED DESCRIPTION

First Embodiment

A semiconductor device having a polysilicon resistor and a field effect transistor according to the first embodiment of the invention is to be described. At first, the manufacturing method is to be described. In each of the following embodiments including the manufacturing steps, description is to be made to a PMOS field effect transistor as a representative of a CMOS field effect transistor.

Figure 1:
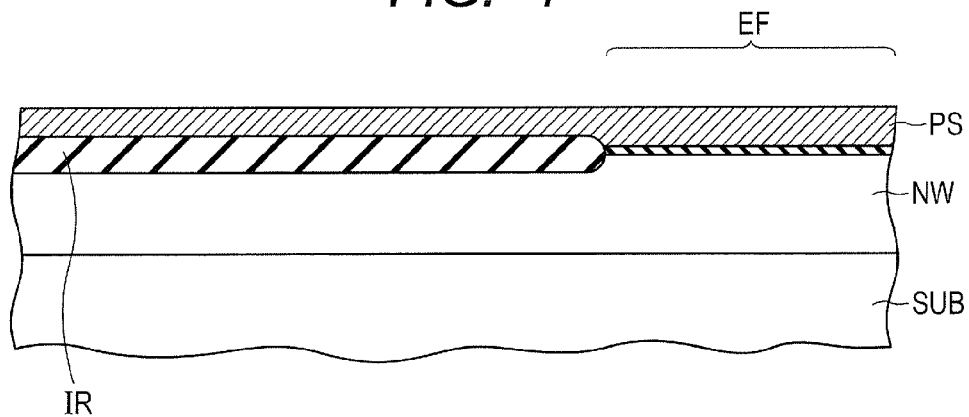
FIG. 1 is a cross sectional view showing a step of a method of manufacturing a semiconductor device according to a first embodiment of the invention.

As shown in FIG. 1, an element forming region EF is defined, for example, by forming an element isolation insulating film IR such as a field oxide film in a predetermined region over the main surface of a P type silicon substrate SUB. An N type well region NW is formed in an element forming region. Further, a P type well region (not illustrated) is formed in other element forming region (not illustrated). Then, a polysilicon film PS at a thickness of about 150 nm is formed so as to cover the element isolation insulating film IR and the element forming region EF.

Figure 2:
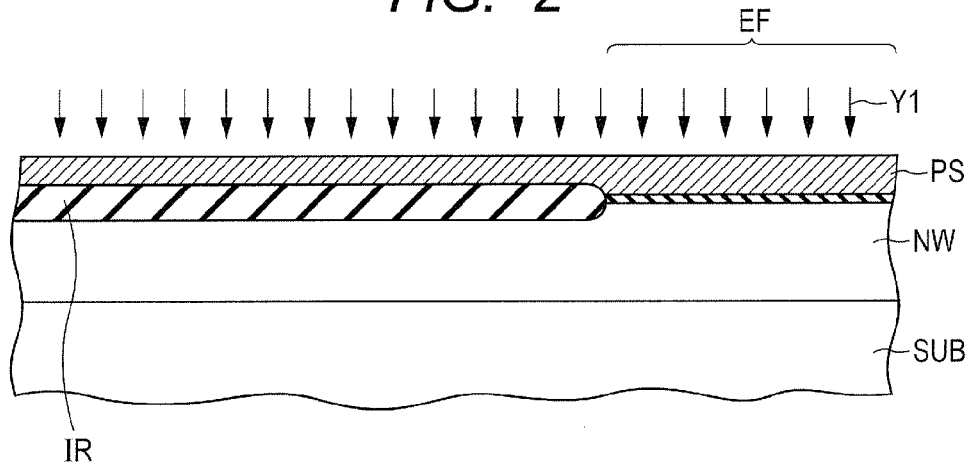
FIG. 2 is a cross sectional view showing a step succeeding to the step shown in FIG. 1 in the first embodiment 1.
Figure 3:
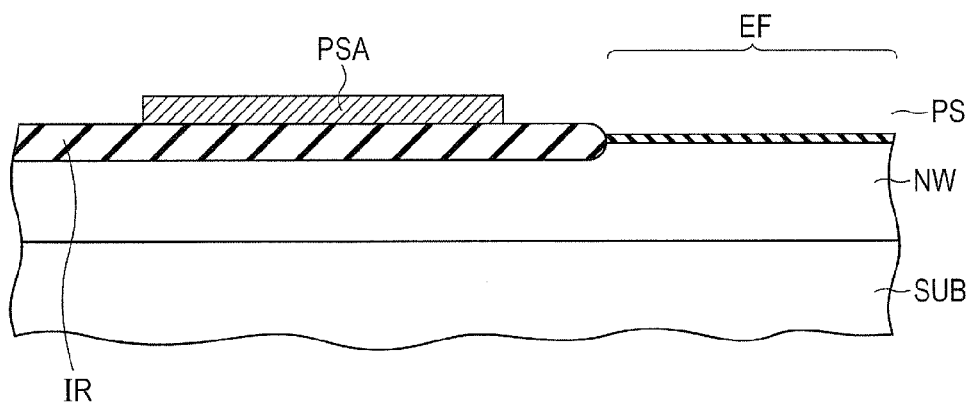
FIG. 3 is a cross sectional view showing a step succeeding to the step shown in FIG. 2 in the first embodiment.

Then, a predetermined amount of an impurity is implanted into the polysilicon film PS so as to provide a desired resistance value for the resistance element. As shown in FIG. 2, $BF_2$ is implanted, for example, as P type impurity (shown by arrow Y1) under predetermined implantation conditions (implantation energy: about 40 KeV, dosage: about $1\times10^{13}$ $cm^{-2}$). Then, a resist pattern (not illustrated) for patterning the polysilicon film PS into a predetermined shape as a resistance element is formed by applying a predetermined photoengraving process. Then, the polysilicon film PS is etched by using the resist pattern as a mask. Thus, as shown in FIG. 3, a polysilicon film PSA that serves as a resistance element is formed over the element isolation insulating film IR.

Then, a CVD (Chemical Vapor Deposition) oxide film (not illustrated) of about 10 nm thickness comprising, for example, TEOS (Tetra Ethyl Ortho Silicate glass) is formed so as to cover the polysilicon film PSA. Then, by applying a predetermined photoengraving process, a resist pattern (not illustrated) is formed for leaving the CVD oxide film as a film covering the polysilicon film PSA. Then, the CVD oxide film is etched by using the resist pattern as a mask to remove a portion of the CVD oxide film situated in the regions except for the portion of the CVD oxide film situated just below the resist pattern.

Figure 4:
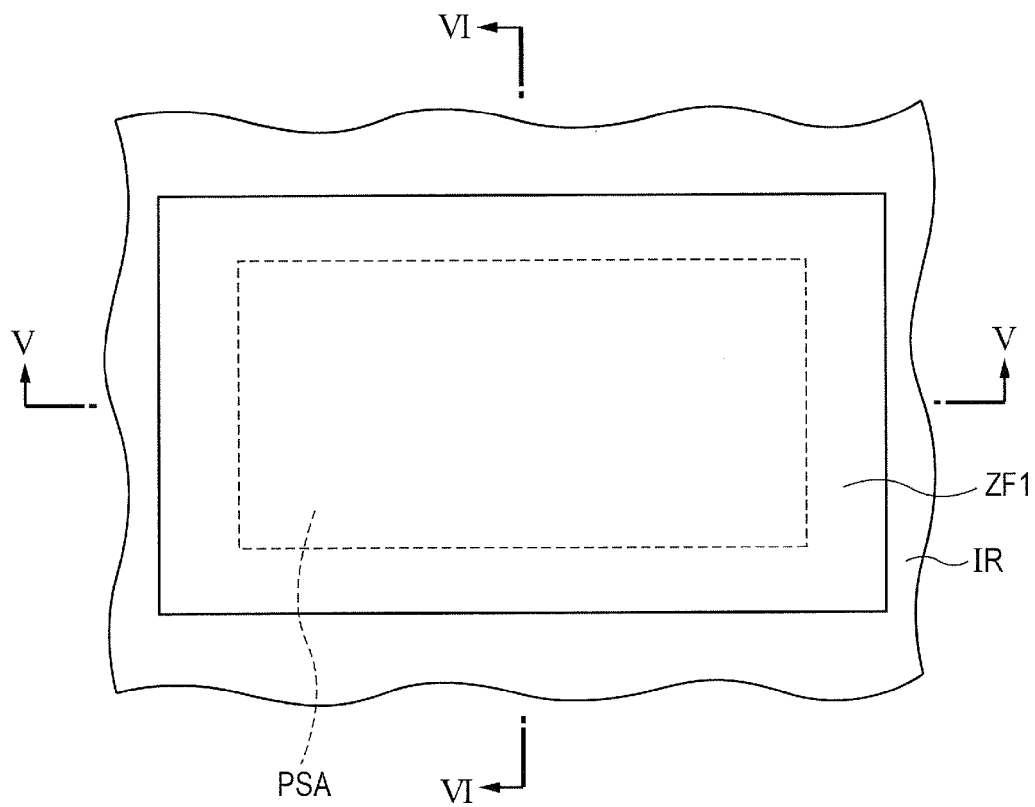
FIG. 4 is a plan view showing a step succeeding to the step shown in FIG. 3 in the first embodiment.
Figure 5:
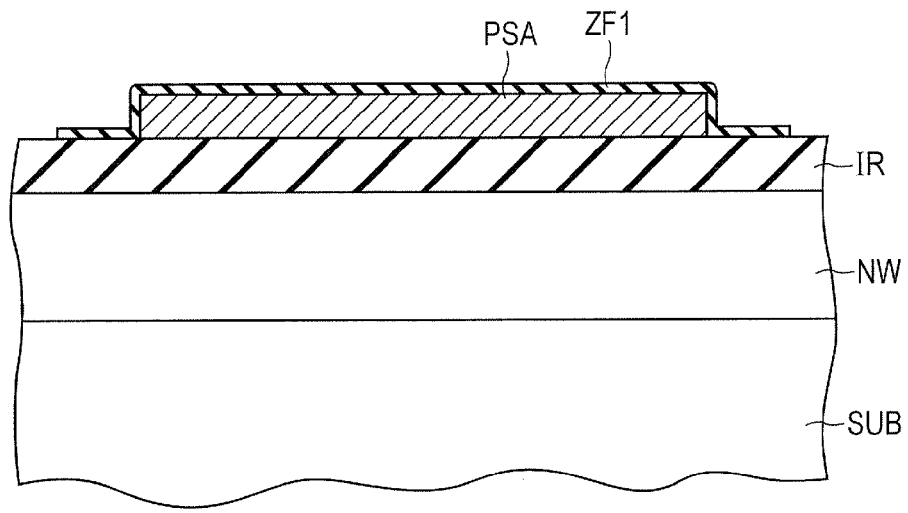
FIG. 5 is a cross sectional view along a cross sectional line V-V shown in FIG. 4 in the first embodiment.
Figure 6:
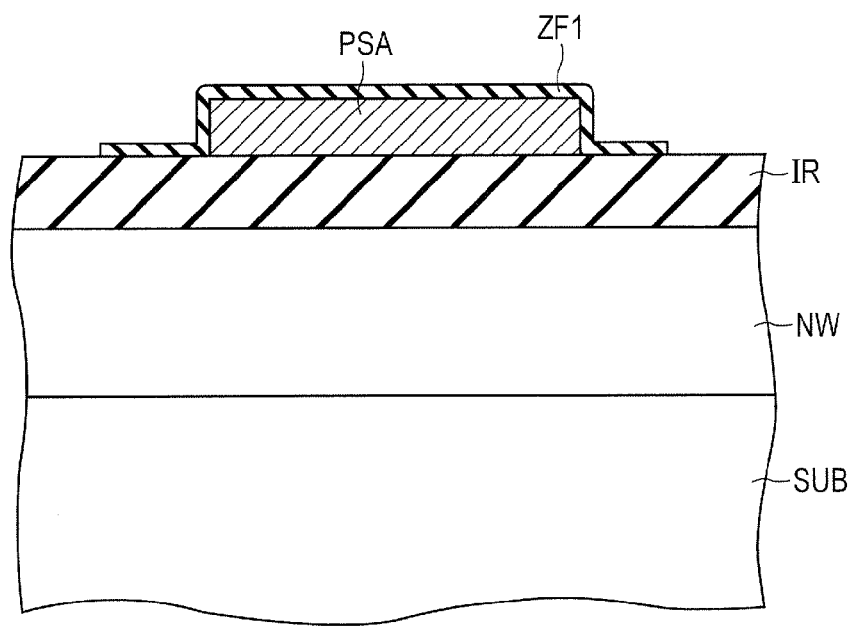
FIG. 6 is a cross sectional view along a cross sectional line VI-VI shown in FIG. 4 in the first embodiment.

Thus, as shown in FIG. 4, FIG. 5, and FIG. 6, a CVD oxide film ZF1 is formed so as to cover the polysilicon film PSA that serves as the polysilicon resistor. The CVD oxide film ZF1 formed by using the resist pattern as a mask continuously covers the polysilicon film PSA from the upper surface to the lateral side for the upper surface and the lateral side. Further, the CVD oxide film ZF1 is extended from the portion covering the lateral side of the polysilicon film PSA in a direction apart from the lateral side of the polysilicon film PSA along the upper surface of the element isolation insulating film IR.

Figure 7:
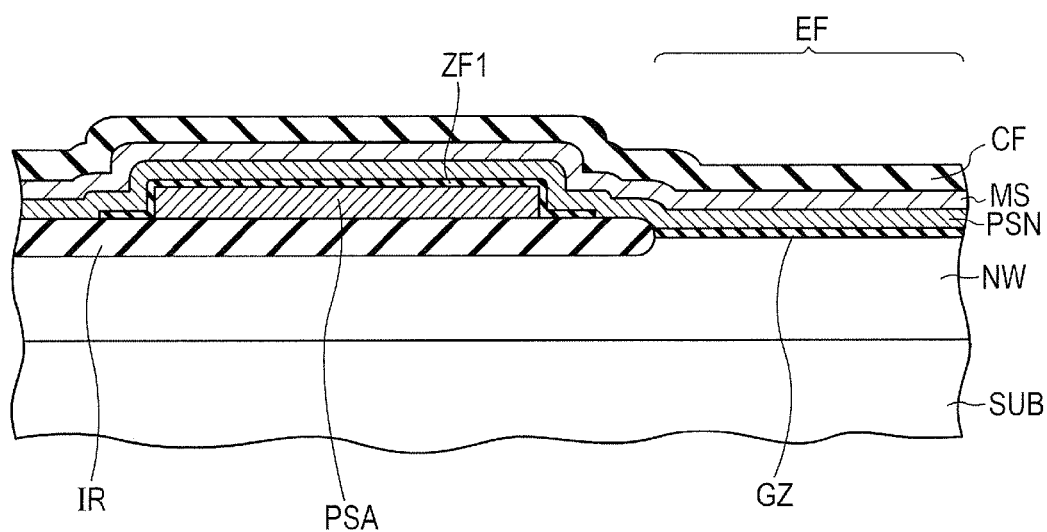
FIG. 7 is a cross sectional view showing a step succeeding to the step shown in FIG. 4 in the first embodiment.

Then, as shown in FIG. 7, a gate oxide film GZ is formed over the surface of the element isolation insulating region EF. An N$^+$ type polysilicon film PSN is formed so as to be in contact with the gate oxide film GZ. A tungsten silicide film MS is formed so as to be in contact with the N$^+$ type polysilicon film PSN. A CVD oxide film CF is formed so as to be in contact with the tungsten silicide film MS.

Figure 8:
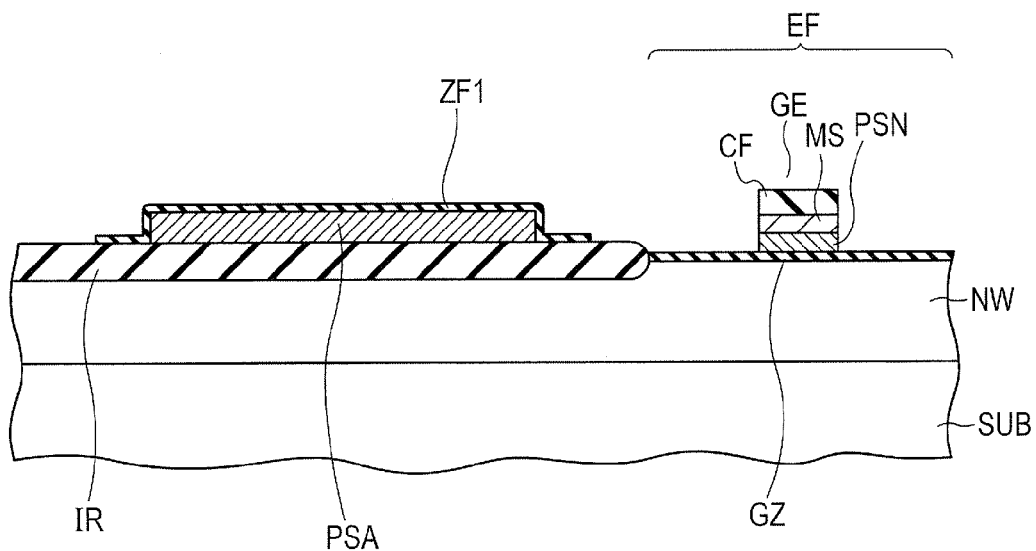
FIG. 8 is a cross sectional view showing a step succeeding to the step shown in FIG. 7 in the first embodiment.

Then, by applying a predetermined photoengraving process, a resist pattern (not illustrated) for patterning the gate electrode is formed. Then, the CVD oxide film CF, the tungsten silicide film MS, and the N$^+$ type polysilicon film PSN are etched by using the resist pattern as a mask. Thus, as shown in FIG. 8, a gate electrode GE is formed in the element forming region EF. In this step, since the polysilicon film PSA that serves as the resistance element is covered by the CVD oxide film ZF1, the polysilicon film PSA is not etched during patterning of the gate electrode GE.

Figure 9:
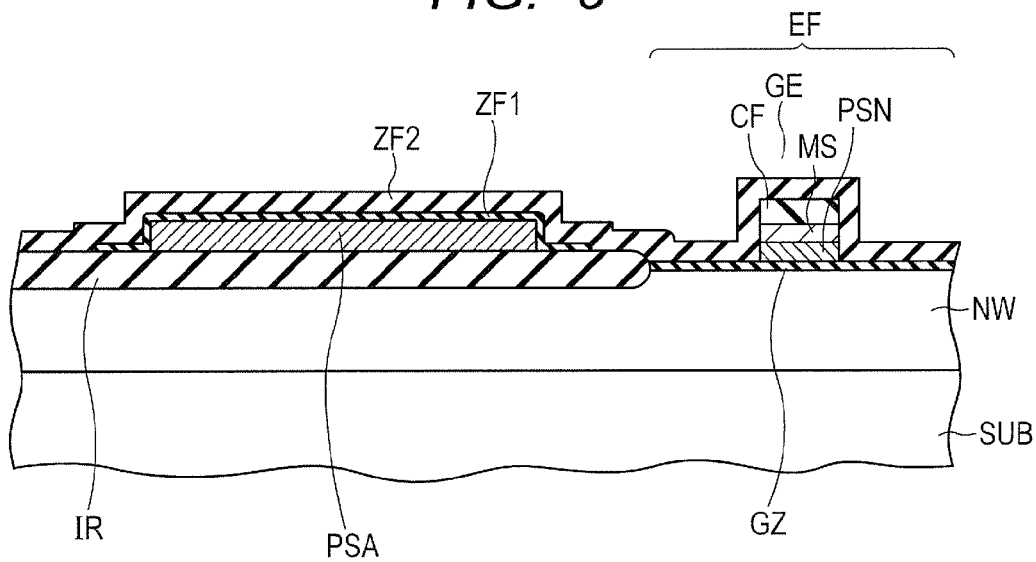
FIG. 9 is a cross sectional view showing a step succeeding to the step shown in FIG. 8 in the first embodiment.

Then, as shown in FIG. 9, a CVD oxide film ZF2 of about 70 nm thickness is formed so as to cover the gate electrode GE and the polysilicon film PSA. Then, by applying a predetermined photoengraving process, a resist pattern RM covering a portion of the polysilicon film PSA (refer to FIG. 10) is formed. The resist pattern RM is formed so as to expose a portion of the polysilicon film PSA where the contact region is formed as a resistance element and cover a portion of the polysilicon film PSA that serves as the resistor main body.

Figure 10:
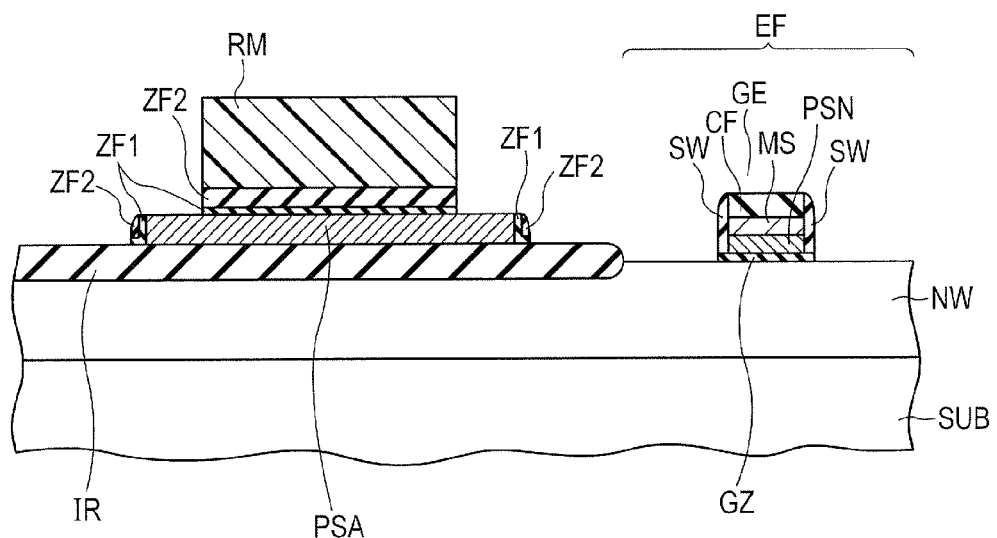
FIG. 10 is a cross sectional view showing a step succeeding to the step shown in FIG. 9 in the first embodiment.
Figure 11:
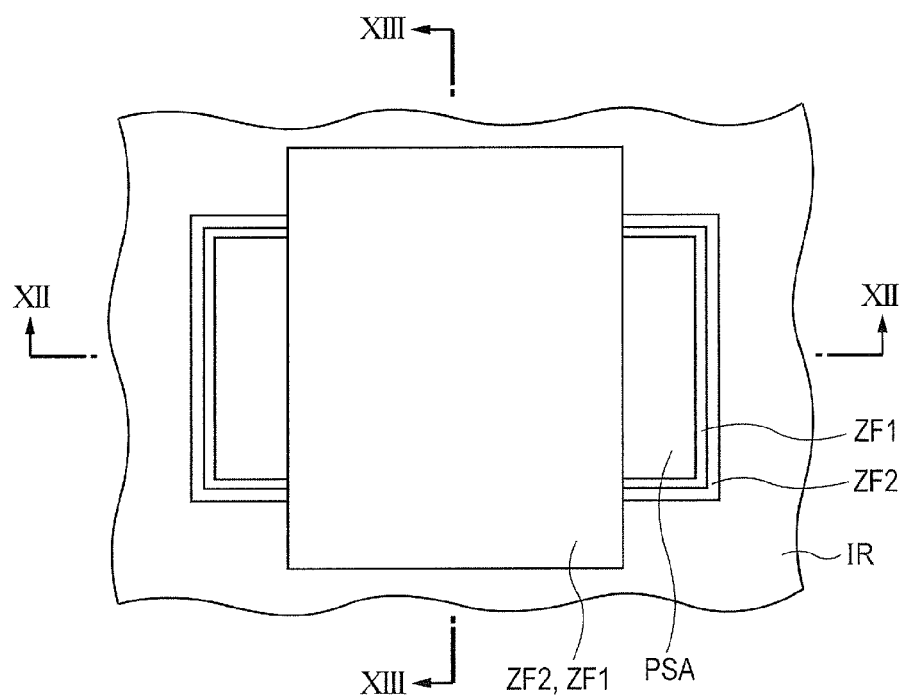
FIG. 11 is a plan view showing a step succeeding to the step shown in FIG. 10 in the first embodiment.
Figure 12:
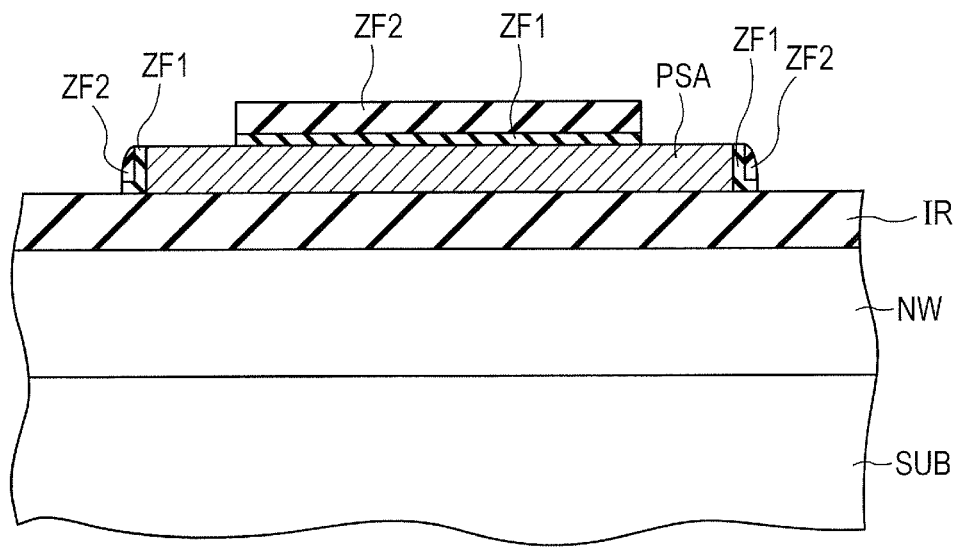
FIG. 12 is a cross sectional view along a cross sectional line XII-XII shown in FIG. 11 in the first embodiment.
Figure 13:
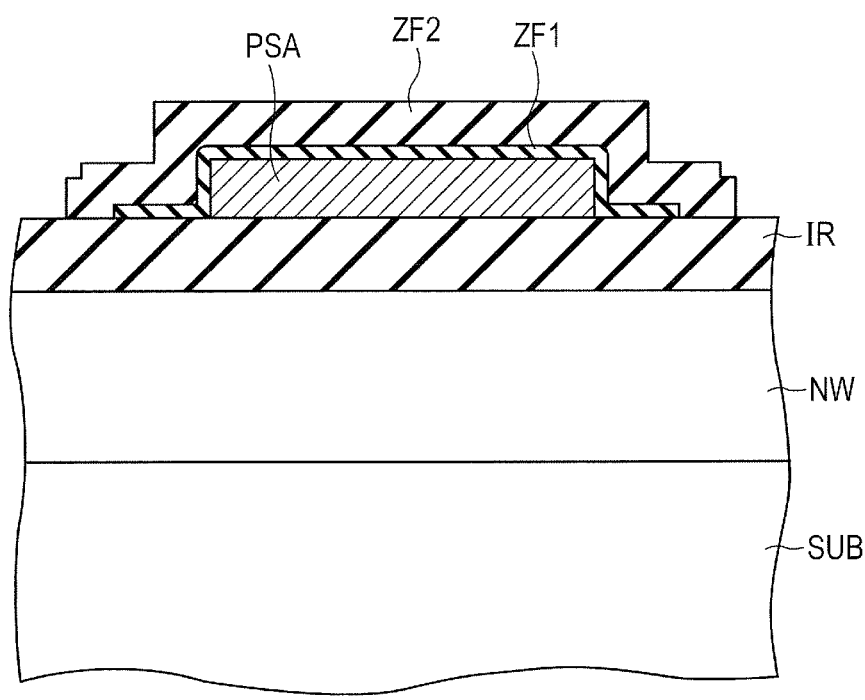
FIG. 13 is a cross sectional view along a cross sectional line XIII-XIII shown in FIG. 11 in the first embodiment.

Then, as shown in FIG. 10, the exposed CVD oxide film ZF2 is etched (dry etched) by using the resist pattern RM as a mask to form a side wall oxide film SW on the lateral side wall of the gate electrode GE. On the other hand, in the polysilicon film PSA, a portion of the CVD oxide film ZF1 and the CVD oxide film ZF2 situated in the region where the contact region is to be formed is removed, leaving respective portions of the CVD oxide film ZF1 and the CVD oxide film ZF2 covering the portion of the polysilicon film PSA that serves as the resistor main body to thereby expose the polysilicon film PSA as shown in FIG. 11, FIG. 12, and FIG. 13. By the etching, the thickness of the portion of the polysilicon film situated in the region where the contact region is formed is decreased to less than the thickness for the portion of the polysilicon film that serves as the resistance main body.

Figure 14:
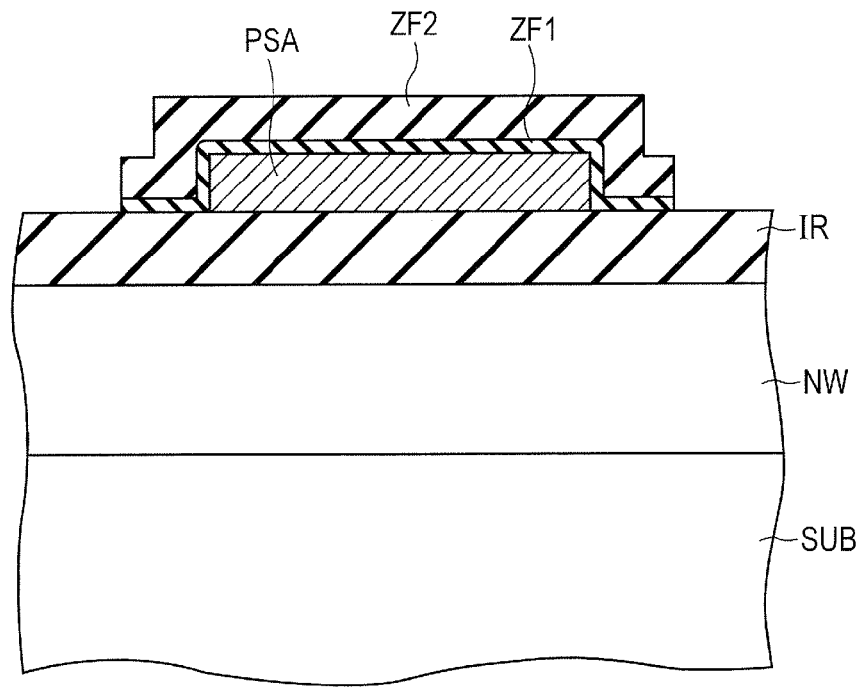
FIG. 14 is a cross sectional view of a modified embodiment along a cross sectional line corresponding to the cross sectional line XIII-XIII shown in FIG. 11 in the first embodiment.

The CVD oxide film ZF2 is left so as to cover the portion of the CVD oxide film ZF1 covering the lateral side of the polysilicon film PSA and the portion of the CVD oxide film ZF1 extending in the direction apart from the lateral side along the upper surface of the element isolation insulating film IR. Depending on the position of the resist pattern RM, the CVD oxide film ZF2 may also be formed sometimes such that the end thereof is situated at a position substantially identical with the end of the CVD oxide film ZF1 or situated further inside as shown in FIG. 14.

Figure 15:
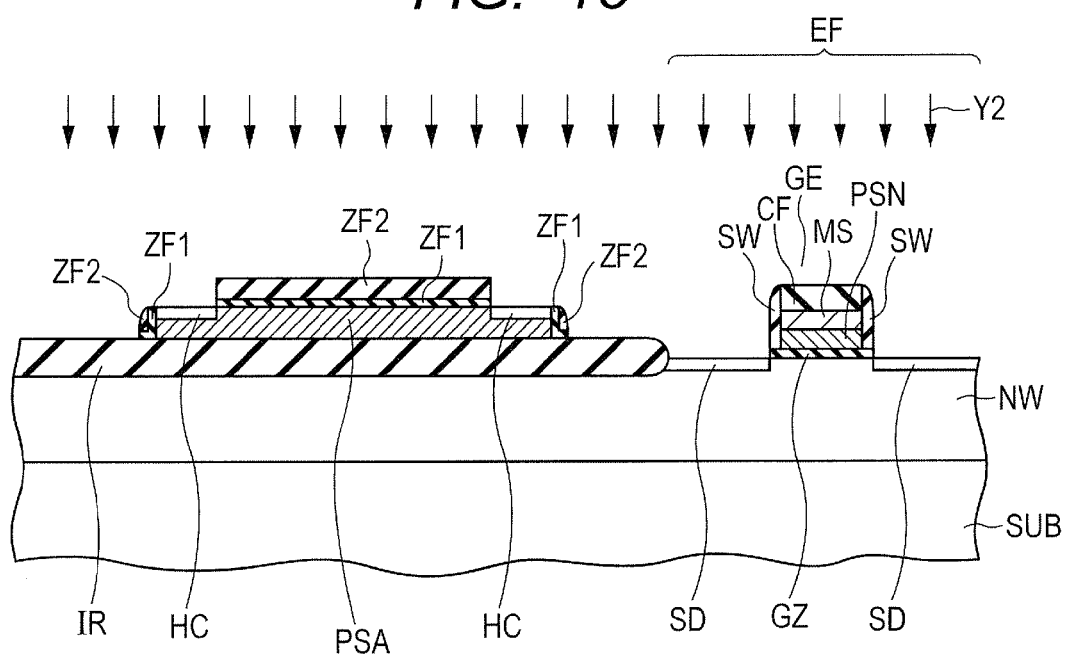
FIG. 15 is a cross sectional view showing a step succeeding to the step shown in FIG. 11 in the first embodiment.

Then, as shown in FIG. 15, by implanting, for example, $BF_2$ as a P type impurity under predetermined implantation conditions (implantation energy: about 50 KeV, dosage: about $4\times10^{15}$ cm$^{-2}$) (shown by arrow Y2), P-type source/drain regions SD are formed in the element forming region EF. On the other hand, P-type high concentration regions HC are formed in the polysilicon film PSA. In this step, since the portion of the polysilicon film PSA that serves as the resistor main body is covered by the CVD oxide film ZF1 and the CVD oxide film ZF2 of a predetermined thickness, implantation of the impurity through the CVD oxide films ZF1 and ZF2 into the polysilicon film PSA is suppressed.

Figure 16:
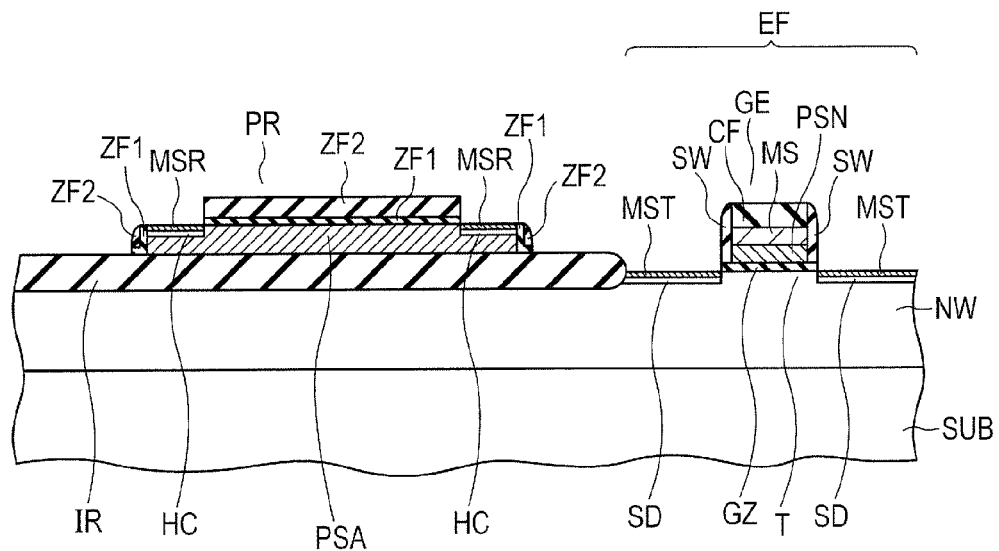
FIG. 16 is a cross sectional view showing a step succeeding to the step shown in FIG. 15 in the first embodiment.

Then, as shown in FIG. 16, a metal silicide film MSR such as a cobalt silicide film is formed over the surface of the polysilicon film PSA from which the silicon (Si) is exposed. A contact region of the resistance element where interconnects (plugs or the like) are electrically connected is formed by the high concentration region HC and the metal silicide film MSR. Thus, a polysilicon resistor PR is formed as a resistance element. On the other hand, a metal silicide film MST is formed over the surface of the element isolation region EF (surface of the source/drain region SD). Thus, a field effect transistor T (PMOS field effect transistor) is formed in the element forming region.

Figure 17:
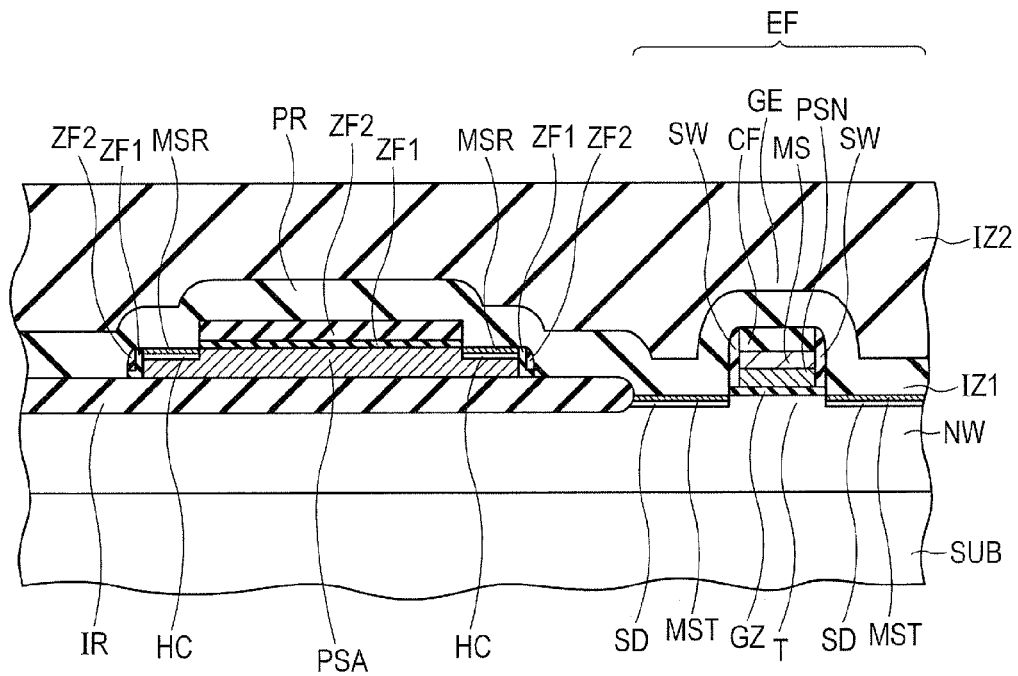
FIG. 17 is a cross sectional view showing a step succeeding to the step shown in FIG. 16 in the first embodiment.

Then, as shown in FIG. 17, an interlayer oxide film IZ1 of about 200 nm thickness is formed so as to cover the gate electrode GE (field effect transistor T) and the polysilicon resistor PR. An interlayer oxide film IZ2 of about 700 nm thickness is further formed so as to cover the interlayer oxide film IZ1.

Figure 18:
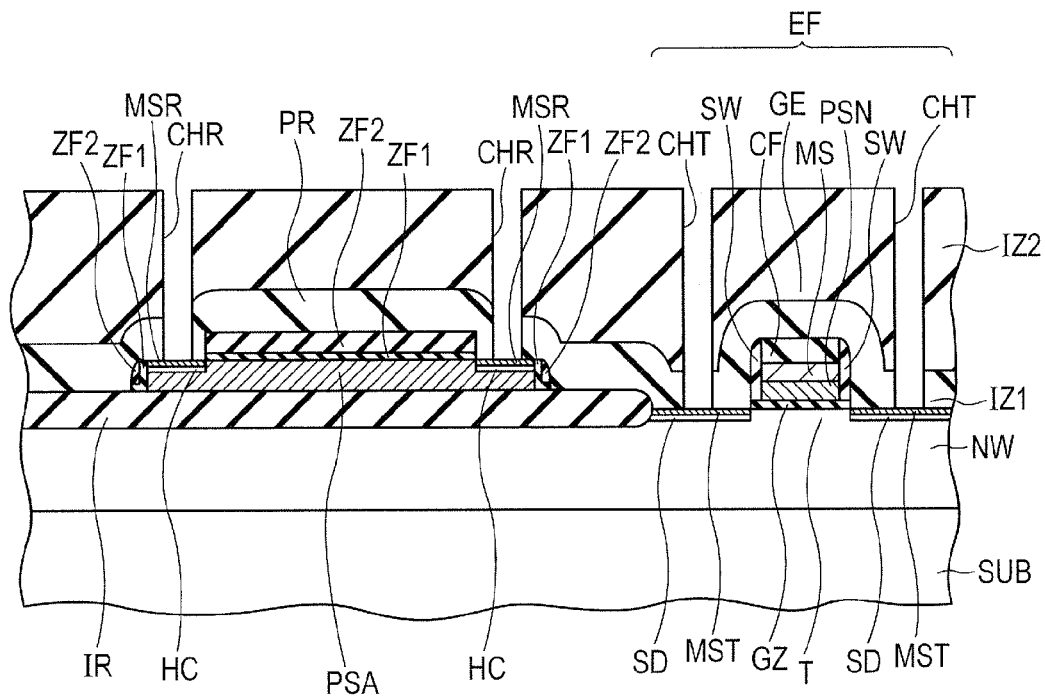
FIG. 18 is a cross sectional view showing a step succeeding to the step shown in FIG. 17 in the first embodiment.

Then, by applying a predetermined photoengraving process, a resist pattern (not illustrated) for forming contact holes is formed. By etching the interlayer oxide films IZ2, IZ1 using the resist pattern as a mask, contact holes CHT for exposing the source/drain regions SD (metal silicide film MST) of the field effect transistor T (PMOS field effect transistor), and contact holes CHR for exposing the contact region (metal silicide film MSR) of the polysilicon resistor PR are formed as shown in FIG. 18.

Figure 19:
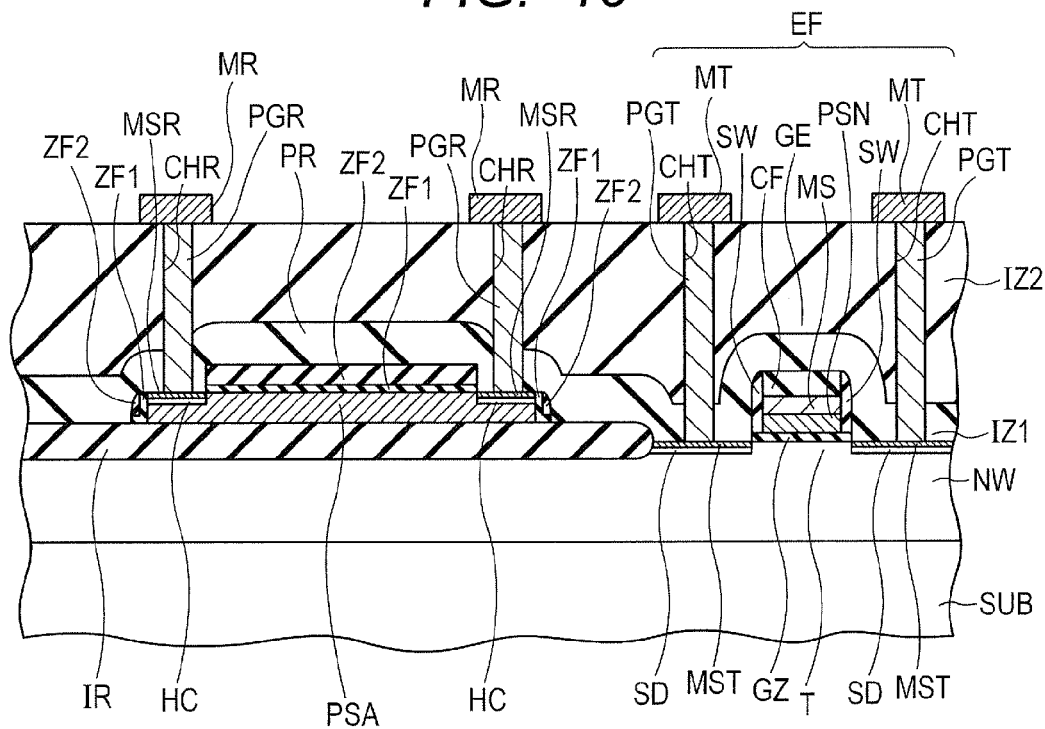
FIG. 19 is a cross sectional view showing a step succeeding to the step shown in FIG. 18 in the first embodiment, which is a cross sectional view showing a main portion of the semiconductor device.

Then, as shown in FIG. 19, a plug PGT is formed in each of the contact holes CHT. Further, plugs PGR are formed in the contact holes CHR. Then, a metal interconnect MT electrically connected with each of the plugs PGT is formed over the interlayer oxide film IZ2. Further, a metal interconnect MR electrically connected with each of the plugs PGR is formed. Then, a metal interconnect at a second layer and a metal interconnect at a third layer (both of them are not illustrated), etc. are formed optionally. A main portion of the semiconductor device is formed as described above.

In the semiconductor device having the polysilicon resistor that serves as the resistance element and the field effect transistor, the polysilicon resistor is formed, particularly, by previously implanting an impurity of a predetermined concentration to a polysilicon film so as to provide a desired resistance value (implantation A) and implanting an impurity at a higher concentration into a region thereof where the contact region is to be formed (implantation B). Implantation B is performed in a state of covering a portion of the polysilicon film that serves as a resistance main body by an implantation mask. In order not to vary the resistance value of the polysilicon resistor, it is necessary that the impurity is not implanted through the implantation mask into the portion of the polysilicon film that serves as the resistor main body upon implantation B.

In the semiconductor device described above, the CVD oxide film ZF1 and the CVD oxide film ZF2 covering the portion of the polysilicon film that serves as the resistor main body are used as the implantation mask. The CVD oxide film ZF1 and the CVD oxide film ZF2 are formed respectively by a CVD method. Thus, the thickness of the CVD oxide films ZF1 and ZF2 can be set easily to such a predetermined thickness that the impurity does not pass through the CVD oxide films ZF1 and ZF2. That is, penetration of the impurity can be inhibited easily by merely changing the thickness of the CVD oxide film for various structures of the semiconductor device including the polysilicon resistor.

Figure 20:
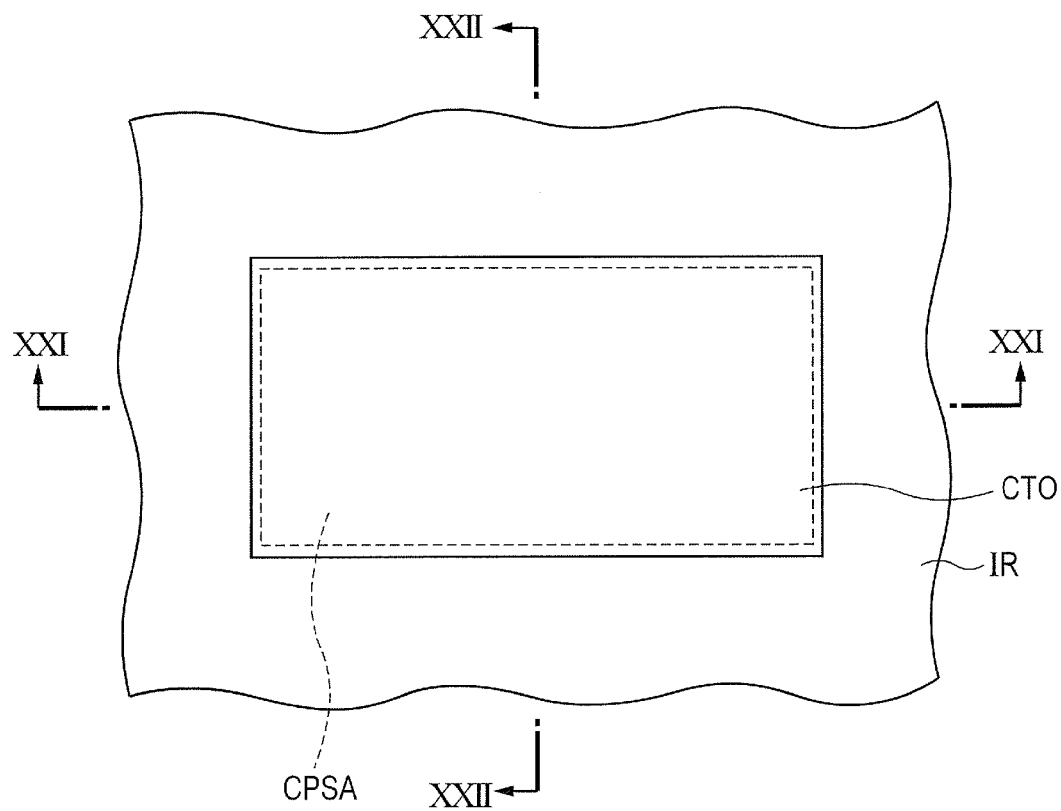
FIG. 20 is a plan view in a step corresponding to the step shown in FIG. 4 in the method of manufacturing a semiconductor device according to a comparative embodiment.
Figure 21:
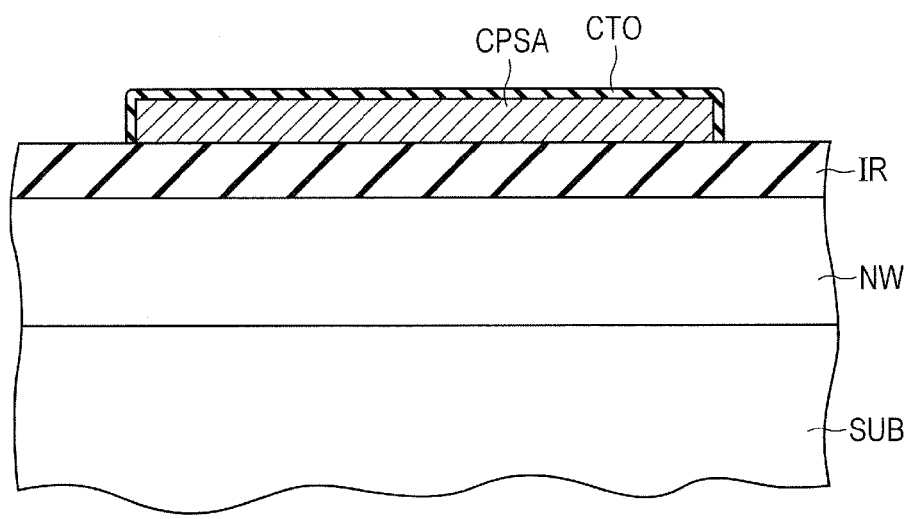
FIG. 21 is a cross sectional view along a cross sectional line XXI-XXI shown in FIG. 20 in the method of manufacturing the semiconductor device according to the comparative embodiment.
Figure 22:
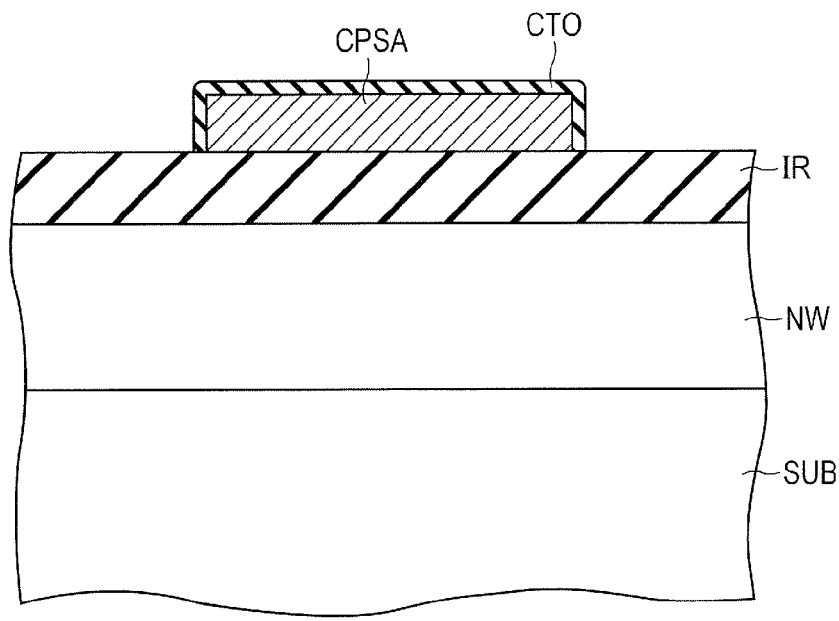
FIG. 22 is a cross sectional view along a cross sectional line XXII-XXII shown in FIG. 20 in the method of manufacturing the semiconductor device according to the comparative embodiment.

As a comparative embodiment, a polysilicon resistor in which an oxide film (thermal oxide film) is formed by applying a thermal oxidation process to the polysilicon film patterned into a predetermined shape as a resistance element is to be described as a comparative embodiment. In this case, as shown in FIG. 20, FIG. 21, and FIG. 22, an oxide film CTO is at first formed from the upper surface to the inside of the polysilicon film CPSA. On the other hand, the oxide film CTO is formed also from the lateral side to the inside of the polysilicon film CPSA. Therefore, on a lateral side of the polysilicon film CPSA, there is not present a portion of the oxide film extending from the lateral side of the polysilicon film CPSA in the direction apart from the lateral side along the upper surface of the element isolation insulating film IR as in the semiconductor device described above.

Figure 23:
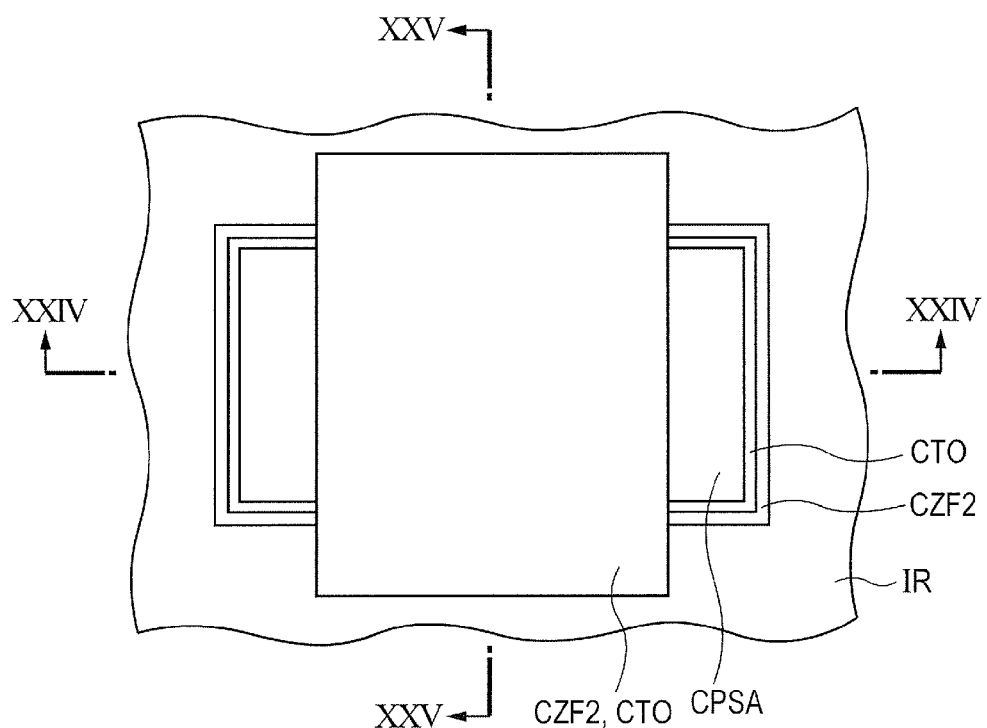
FIG. 23 is a plan view in a step corresponding to the step shown in FIG. 11 in the method of manufacturing the semiconductor device according to the comparative embodiment.
Figure 24:
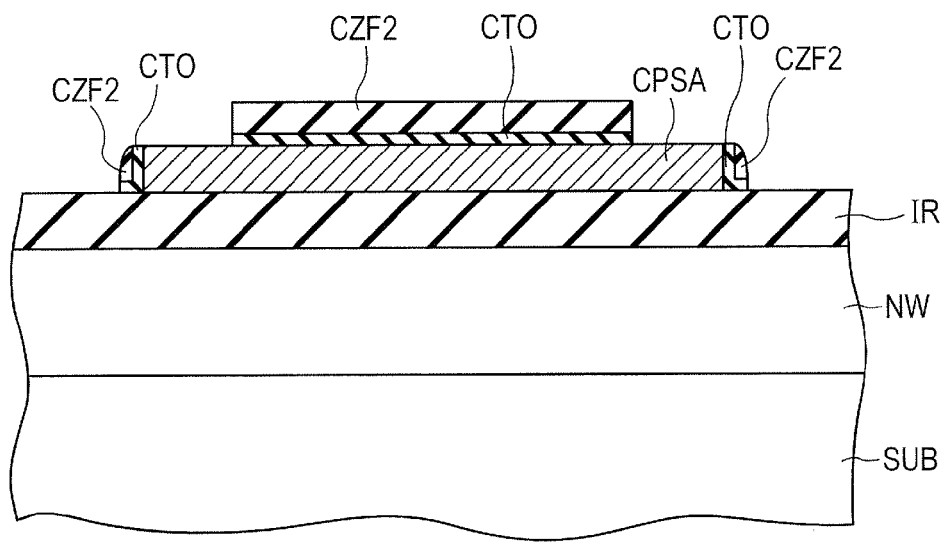
FIG. 24 is a cross sectional view along a cross sectional line XXIV-XXIV shown in FIG. 23 in the method of manufacturing the semiconductor device according to the comparative embodiment.
Figure 25:
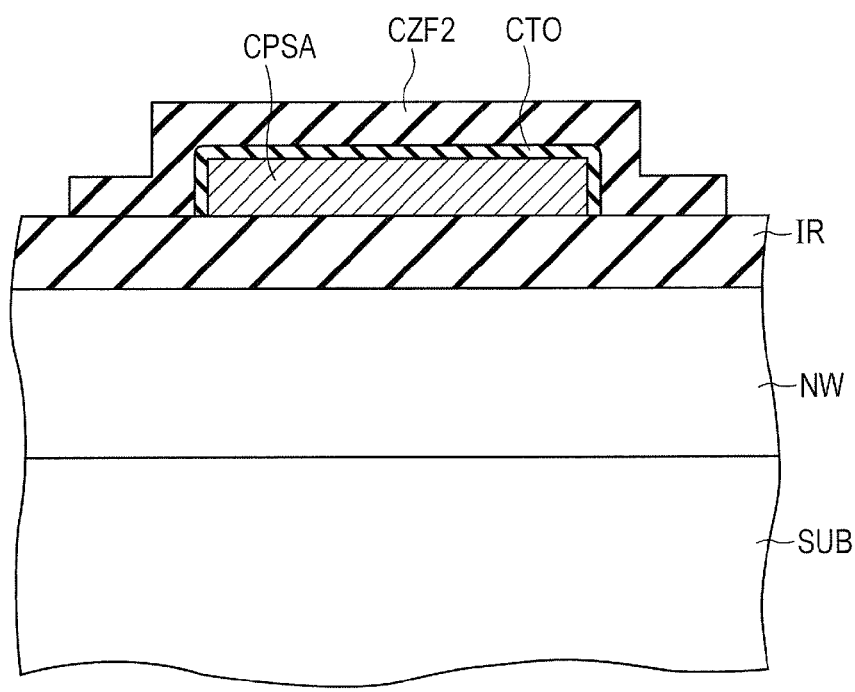
FIG. 25 is a cross sectional view along a cross sectional line XXV-XXV shown in FIG. 23 in the method of manufacturing the semiconductor device according to the comparative embodiment.

Then, a CVD oxide film is formed covering the oxide film CTO and, by applying a predetermined etching process corresponding to the step shown in FIG. 10, the portion of the oxide film CTO and the CVD oxide film CZF2 situated in a region where the contact region is formed is removed, leaving the portion of the oxide film CTO and the CVD oxide film CZF2 to be used as the implantation mask are removed as shown in FIG. 23, FIG. 24, and FIG. 25. Then, a polysilicon resistor according to the comparative embodiment is formed by performing the predetermined implantation corresponding to the step shown in FIG. 15.

In the polysilicon resistor according to the comparative embodiment, oxidation proceeds from the surface to the inside of the polysilicon film CPSA by applying the thermal oxidation process to the polysilicon film CPSA. Therefore, since it is considered that the surface of the polysilicon film CPSA patterned into the predetermined shape may be oxidized to vary the resistance value as the resistance element, there is a limit on the thickness of the oxide film CTO. Accordingly, it is considered that the impurity pass through the implantation mask.

On the contrary, in the semiconductor device described above, the polysilicon film that serves as the polysilicon resistor is not thermally oxidized, and it may suffice to control the thickness of the CVD oxide films ZF1 and ZF2, and variation of the resistance value of the polysilicon resistor can be suppressed by inhibiting the penetration of the impurity through the implantation mask upon implantation corresponding to the implantation B.

The resistance element in the semiconductor device described above and the resistance element in the comparative embodiment have the following structural difference. That is, a portion of the CVD oxide film ZF1 extending from the lateral side of the polysilicon film PSA in a direction apart from the lateral side along the upper surface of the element isolation insulating film IR is present in the CVD oxide film ZF1 of the resistance element in the semiconductor device described above, whereas such a portion extending along the upper surface of the element isolation insulating film IR is not present in the oxide film of the resistance element according to the comparative embodiment.

Figure 26:
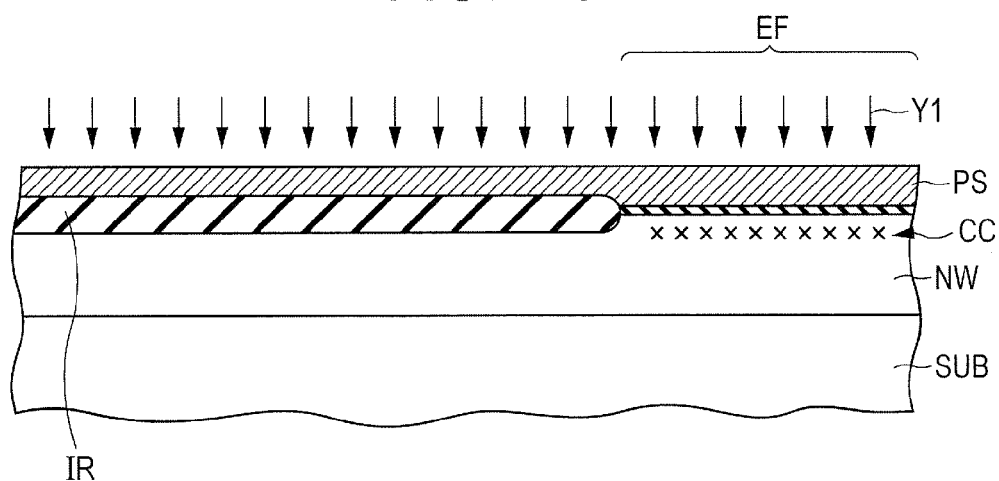
FIG. 26 is a cross sectional view showing a modified embodiment of the step shown in FIG. 2 in the first embodiment.

Referring to the penetration of the impurity, it is considered that when the impurity for providing a desired resistance value of the resistance element is implanted into the polysilicon film, the impurity may be implanted through the polysilicon film into the element forming region. In this case, a P-type impurity is additionally implanted into the element forming region EF where the field effect transistor (PMOS field effect transistor) is formed as shown in FIG. 26 to change the impurity concentration, for example, in an N-type well region NW. Accordingly, electric characteristics of the PMOS field effect transistor are fluctuated.

Figure 27:
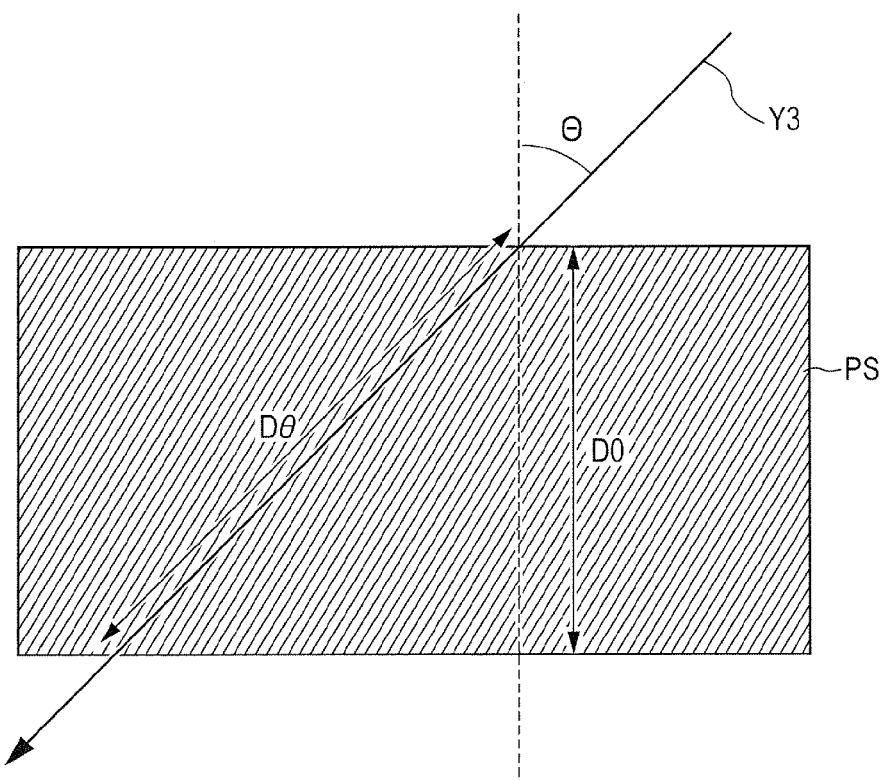
FIG. 27 is a fragmentary enlarged cross sectional view showing the state of implanting an impurity in the step shown in FIG. 26 in the first embodiment.

For suppressing such penetration of the impurity, it is desirable that the impurity is implanted obliquely to the surface of the polysilicon film. As shown in FIG. 27, the distance D0 in the direction of the depth (oblique distance Dθ×cos θ) can be shortened by so much as the impurity proceeds obliquely in the polysilicon film (distance Dθ) by setting the implantation angle (incident angle) of the impurity as θ. This can inhibit the penetration of the impurity through the polysilicon film thereby suppressing the variation of the threshold voltage of the field effect transistor. This method is applicable also to semiconductor devices of other embodiments.

Second Embodiment

A semiconductor device having a polysilicon resistor and a field effect transistor according to the second embodiment of the invention is to be described. At first, a manufacturing method thereof is to be described.

Figure 28:
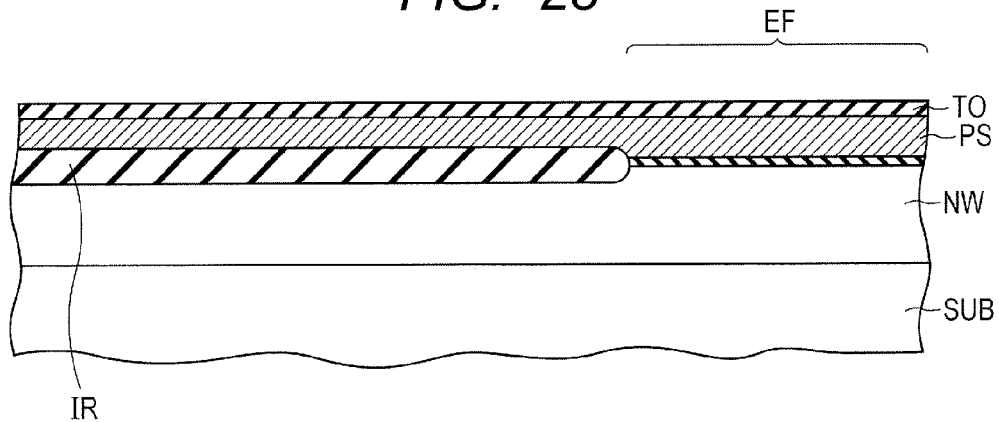
FIG. 28 is a cross sectional view showing a step of a method of manufacturing a semiconductor device according to a second embodiment of the invention.

After the step identical with the step shown in FIG. 1 described above, an oxide film (thermal oxide film) TO of about 20 nm thickness is formed over the surface of a polysilicon film PS by applying a thermal oxidation process as shown in FIG. 28. Since the surface of the polysilicon film PS is covered by the oxide film TO, cross contamination can be prevented upon subsequent ion implantation. Further, an undesired effect due to intrusion of the impurity in the subsequent step can be prevented.

Figure 29:
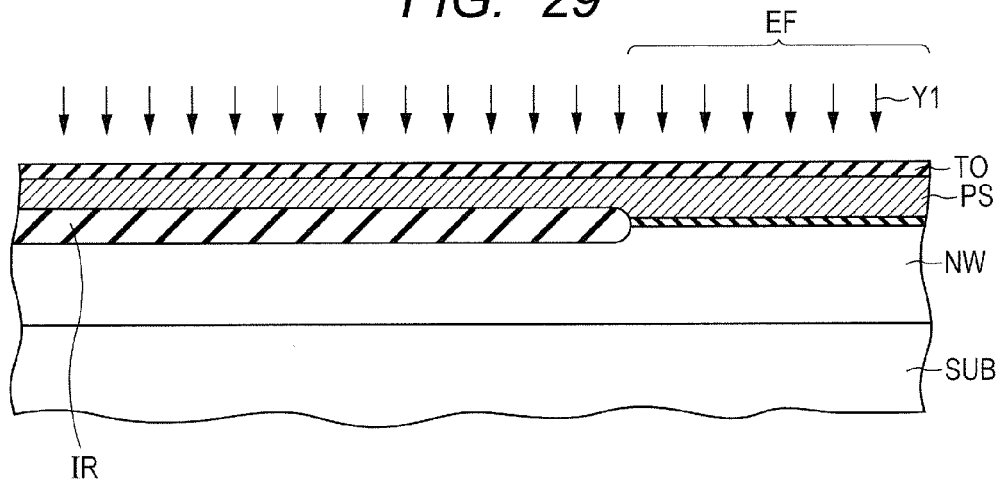
FIG. 29 is a cross sectional view showing a step succeeding to the step shown in FIG. 28 in the second embodiment.

Then, a predetermined amount of impurity is implanted into the polysilicon film PS so as to provide a desired resistance value of the resistance element. As shown in FIG. 29, $BF_2$ is implanted, for example, as the P-type impurity under predetermined implantation conditions (implantation energy: about 40 KeV, dosage: about $1 \times 10^{13}$ cm$^{-2}$) (shown by arrow Y1).

Figure 30:
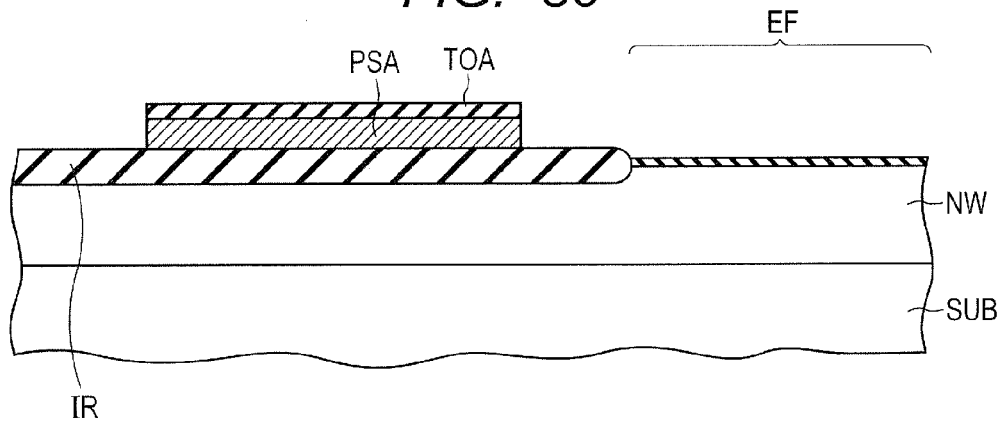
FIG. 30 is a cross sectional view showing a step succeeding to the step shown in FIG. 29 in the second embodiment.

Then, by applying a predetermined photoengraving process, a resist pattern (not illustrated) for patterning the polysilicon film PS into a predetermined shape as the resistance element is formed. Then, the oxide film TO and the polysilicon film PS are etched using the resist pattern that serves as a mask. Thus, as shown in FIG. 30, a polysilicon film PSA that serves as a resistance element is formed over the element isolation insulating film IR. A patterned oxide film TOA is positioned over the upper surface of the polysilicon film PSA.

Figure 31:
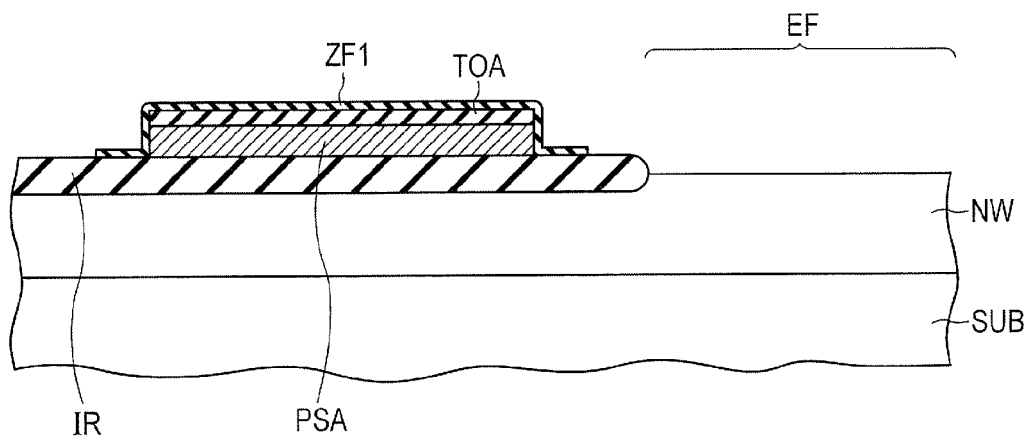
FIG. 31 is a cross sectional view showing a step succeeding to the step shown in FIG. 30 in the second embodiment.

Then, a CVD film of about 10 nm thickness comprising TEOS film, etc. (not illustrate) is formed so as to cover the polysilicon film PSA, and, by applying a predetermined photoengraving process to the CVD oxide film, a resist pattern (not illustrated) is formed for leaving the CVD oxide film as a film covering the polysilicon film PSA. Then, by etching the CVD oxide film using the resist pattern as a mask, the portion of the CVD oxide film other than the portion situated just below the resist pattern, is removed. Thus, the CVD oxide film ZF1 is formed so as to cover the polysilicon film PSA that serves as the polysilicon resistor and the oxide film TOA as shown in FIG. 31.

Figure 32:
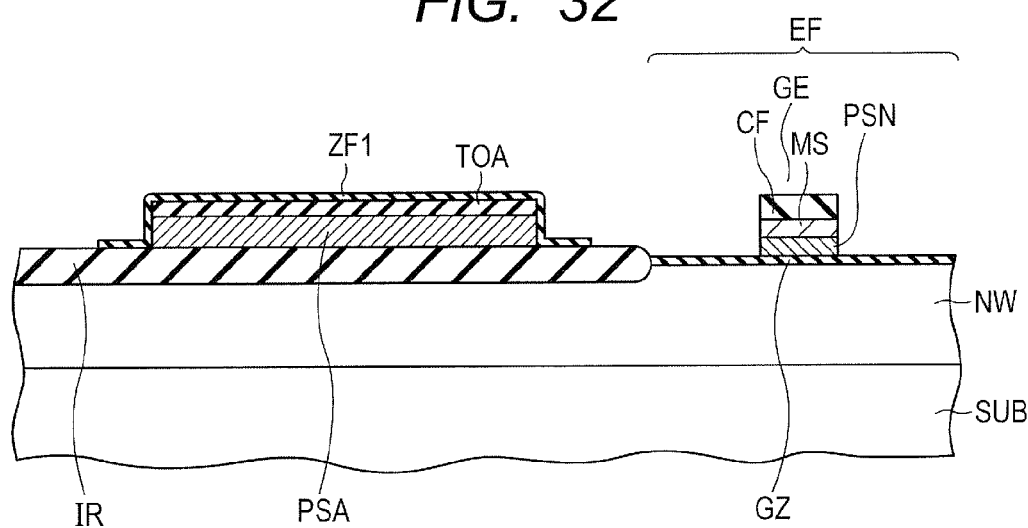
FIG. 32 is a cross sectional view showing a step succeeding to the step shown in FIG. 31 in the second embodiment.

Then, after the steps identical with the steps shown in FIG. 7 and FIG. 8, a gate electrode GE is formed in the element forming region EF as shown in FIG. 32. In this step, since the polysilicon film PSA that serves as the resistance element is covered by the oxide film TOA and the CVD oxide film ZF1, the polysilicon film PSA is not etched during patterning of the gate electrode GF.

Figure 33:
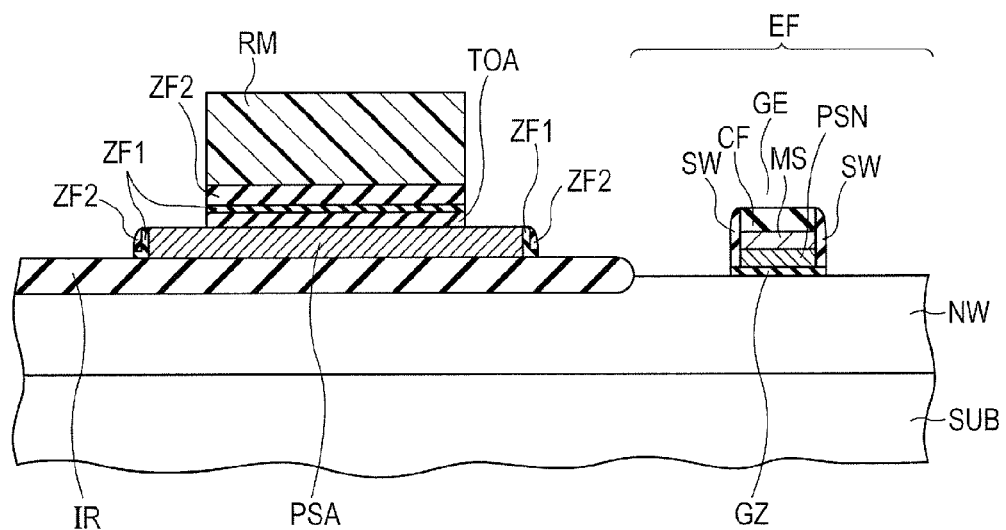
FIG. 33 is a cross sectional view showing a step succeeding to the step shown in FIG. 32 in the second embodiment.

Then, after the step identical with the step shown in FIG. 9, a side wall oxide film SW is formed on the side wall of the gate electrode GE etching (dry etching) the exposed CVD oxide film ZF2 by using the resist pattern RM as a mask as shown in FIG. 33. On the other hand, above the polysilicon film PSA, respective portions of the oxide film TOA, the CVD oxide film ZF1, and the CVD oxide film ZF2 situated in the region where the contact region is formed are removed, leaving the respective portions of the oxide film TOA, the CVD oxide film ZF1, and the CVD oxide film ZF2 covering the portion of the polysilicon PSA that serves as a resistor main body to expose the polysilicon film PSA.

Figure 34:
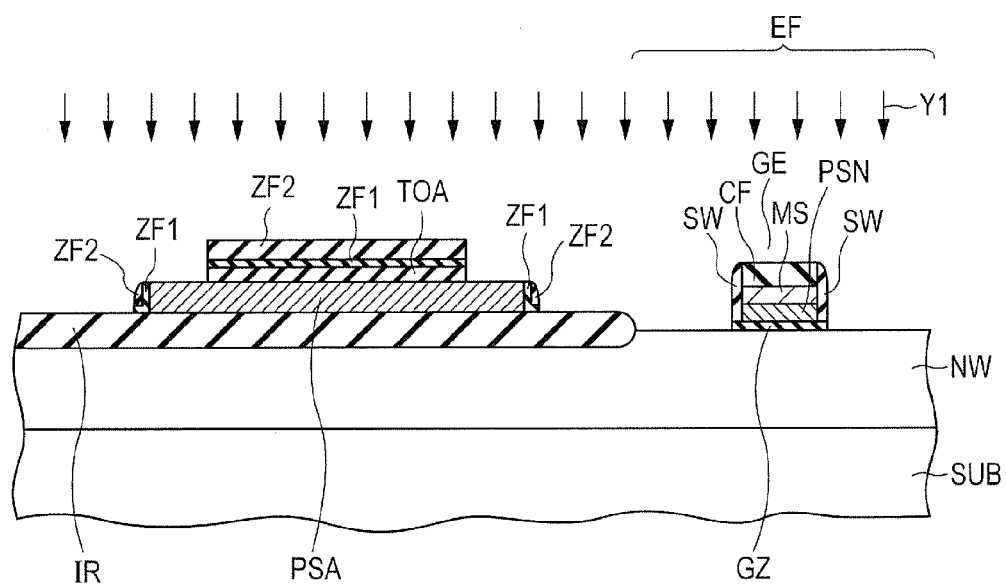
FIG. 34 is a cross sectional view showing a step succeeding to the step shown in FIG. 33 in the second embodiment.

Then, as shown in FIG. 34, P-type source/drain regions SD are formed in the element forming region EF by implanting a P-type impurity, for example, $BF_2$ under predetermined implantation conditions (implantation energy: about 50 KeV, dosage: about $4 \times 10^{15}$ cm$^{-2}$) (shown by arrow Y2). On the other hand, P type high concentration regions CH are formed in the polysilicon film PSA. In this case, since the portion of the polysilicon film PSA that serves as the resistance main body is covered by a stacked film of a predetermined thickness comprising the oxide film TOA, the CVD oxide film ZF1, and the CVD oxide film ZF2, implantation of the impurity through the stacked film (oxide film TOA, CVD oxide film ZF1, and CVD oxide film ZF2) into the polysilicon film PSA is suppressed.

Figure 35:
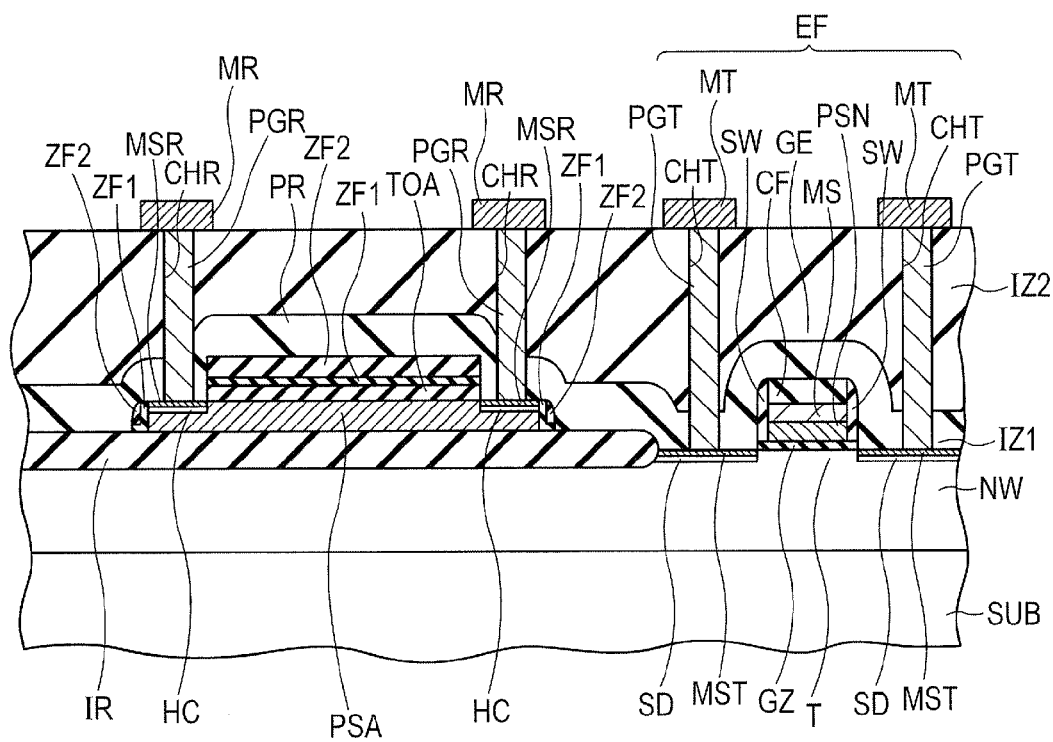
FIG. 35 is a cross sectional view showing a step succeeding to the step shown in FIG. 34 in the second embodiment, which is a cross sectional view showing a main portion of the semiconductor device.

Then, by way of steps identical with the steps shown in FIG. 16 to FIG. 19, a main portion of the semiconductor device is completed as shown in FIG. 35. Identical members with those of the semiconductor device shown in FIG. 19 carry the same reference numerals, for which description is not repeated.

As has been described above, when an impurity at a high concentration is implanted into the polysilicon resistor as the resistance element in a region that serves as the contact region (implantation B), it is necessary to avoid implantation of the impurity through the implantation mask into the polysilicon film where the impurity at a predetermined concentration has already been implanted (implantation A). Penetration of the impurity through the implantation mask can be inhibited by increasing the thickness of the CVD oxide film ZF1, etc.

However, increase in the thickness of the CVD oxide film 2F1 is limited depending on etching upon patterning the CVD oxide film ZF1. In the polysilicon resistor of the semiconductor device described above, penetration of the impurity can be inhibited more reliably by forming the oxide film TOA by thermal oxidation of the polysilicon film before patterning into a predetermined shape. This is to be described specifically.

At first, it is defined such that the thickness of the CVD oxide film ZF1 formed over the polysilicon film that serves as the resistance element is about 10 nm and the thickness of the CVD oxide film ZF2 is about 70 nm thereby defining the total thickness of the CVD oxide film that serves as the implantation mask to 80 nm. Assuming the distribution of the impurity by implantation as a normal distribution, the average penetration depth as Rp, and the standard deviation as $\Delta Rp$, the projected penetration depth by the implantation of the P-type impurity is represented by the following formula.

Projected penetration depth=$Rp+3\times\Delta Rp$

When the numerical values Rp=0.03377 µm, and $\Delta Rp$=0.01563 µm are substituted as the values for Rp and $\Delta Rp$ upon implantation of $BF_2$ into the silicon oxide film at an implantation energy of 50 KeV, the projected penetration depth is about 81 nm (0.081 µm). The amount of implantation contained in the projected penetration depth corresponds to 99.74% of the entire implantation amount. Then, when $BF_2$ is implanted at a dosage of $4\times10^{15}$ cm$^{-2}$, $BF_2$ at $1\times10^{13}$ cm$^{-2}$ corresponding to the remaining amount of 0.26% is implanted through the oxide film (CVD oxide film) into the polysilicon film.

In a resistance element at a relatively low resistance formed, for example, by implanting $BF_2$ at a dosage of $1\times10^{14}$ cm$^{-2}$ or more into the polysilicon film, the amount of penetration of $BF_2$ of about $1\times10^{13}$ cm$^{-2}$ causes no substantial problem.

On the other hand, in a resistance element at a relatively high resistance formed, for example, by implanting $BF_2$ at a dosage of about $1\times10^{13}$ cm$^{-2}$ into the polysilicon film, the amount of penetration of $BF_2$ at about $1\times10^{13}$ cm$^{-2}$ is at a level identical with the implantation amount of $BF_2$ implanted into the polysilicon film. Therefore, the resistance value of the resistance element cannot be determined by implantation A and the resistance value of the resistance element varies.

Figure 36:
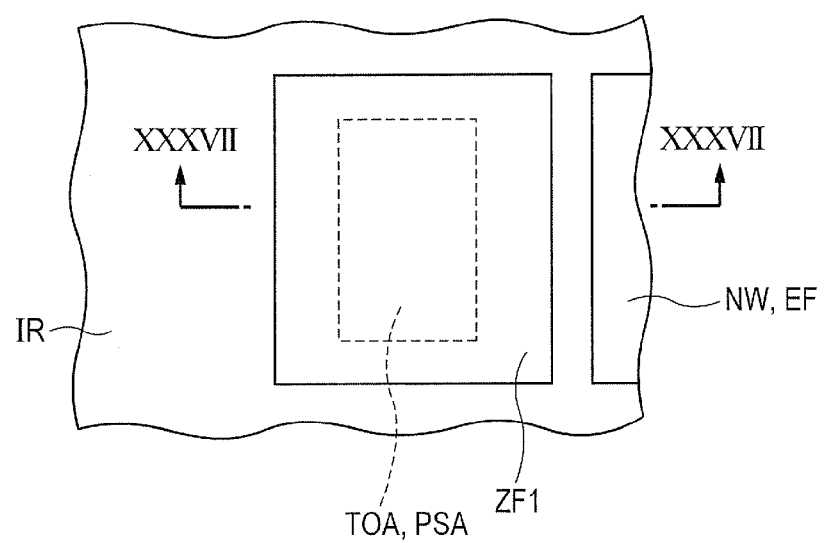
FIG. 36 is a fragmentary enlarged plan view showing a step corresponding to the step shown in FIG. 31 in the method of manufacturing the semiconductor device according to a comparative embodiment.
Figure 37:
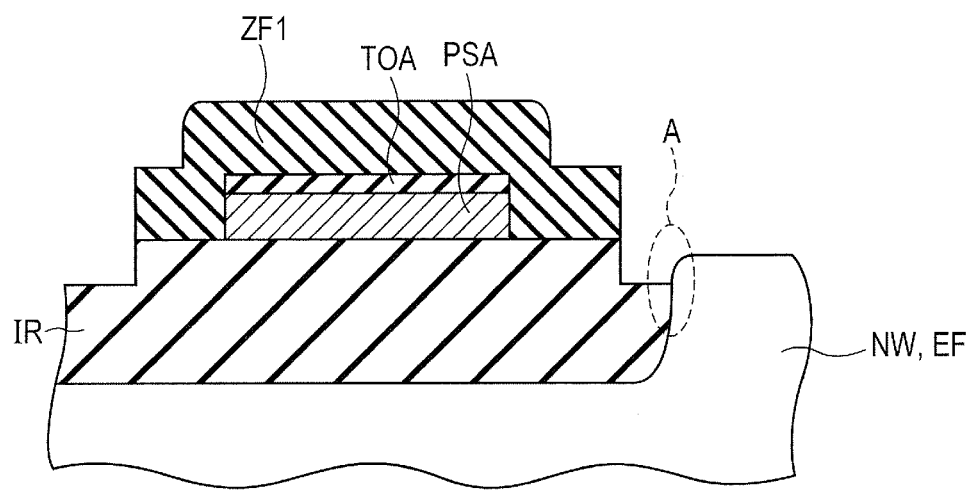
FIG. 37 is a cross sectional view along a cross sectional line XXXVII-XXXVII shown in FIG. 36 in the method of manufacturing the semiconductor device according to the comparative embodiment.

One of countermeasures for inhibiting the penetration of the impurity includes a method of increasing the thickness of the CVD oxide film ZF1. As described above, the CVD oxide film ZF1 is removed at a region other than the portion covering the polysilicon film. In this process, the amount of overetching upon patterning the CVD oxide film ZF1 increases more as the thickness of the CVD oxide film ZF1 is larger. Accordingly, as shown in FIG. 36 and FIG. 37, the surface of the element isolation insulating film IR is lowered below the surface of the element forming region EF (silicon substrate) and it may be considered that a step is formed at the boundary between the element forming region EF and the element isolation insulating film IR.

Figure 38:
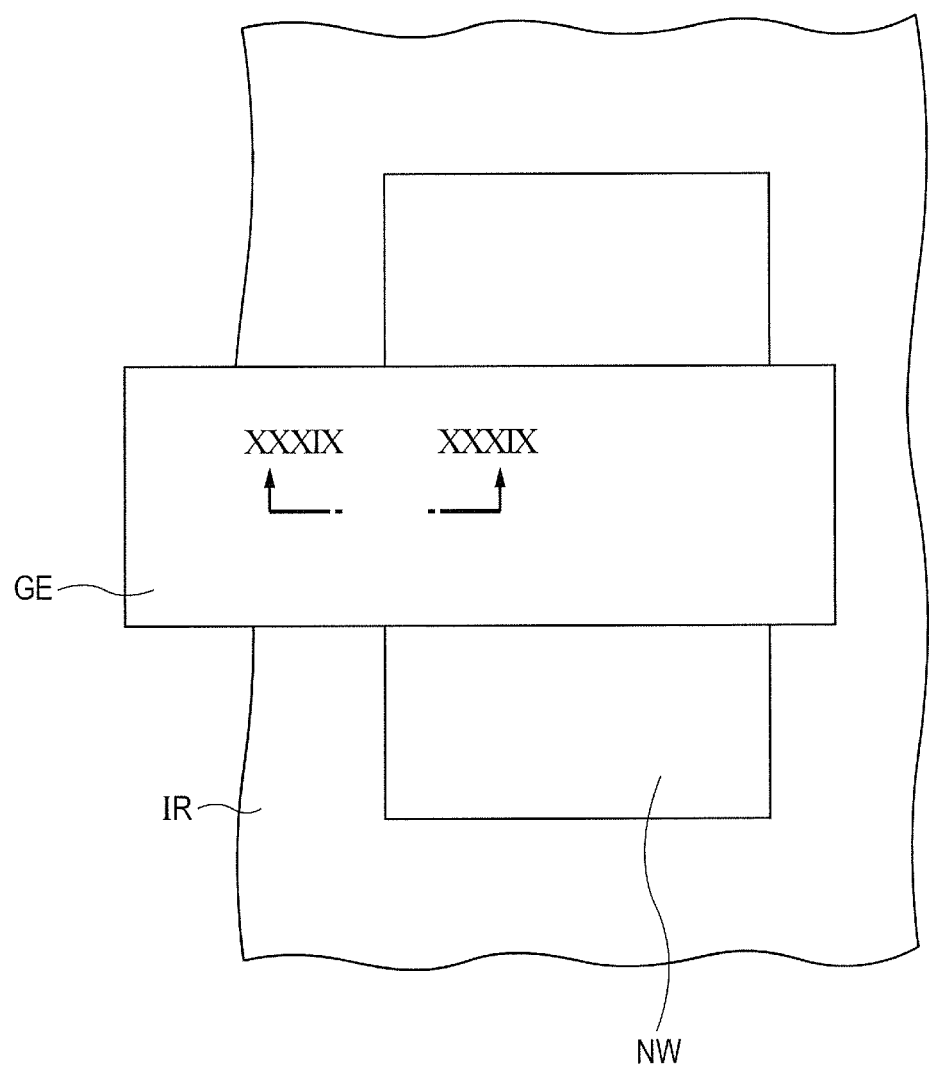
FIG. 38 is a fragmentary enlarged plan view showing a step corresponding to the step shown in FIG. 32 in the method of manufacturing the semiconductor device according to the comparative embodiment.
Figure 39:
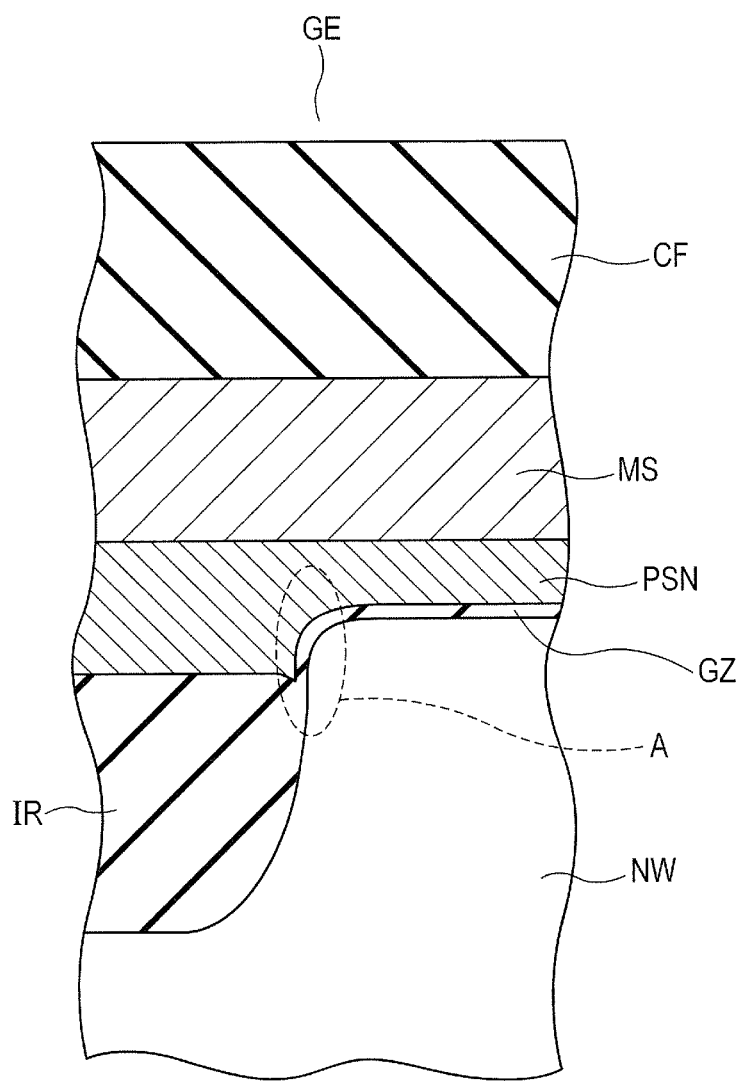
FIG. 39 is cross sectional view along a cross sectional line XXXIX-XXXIX shown in FIG. 38 in the method of manufacturing the semiconductor device according to the comparative embodiment.

When the gate oxide film is formed in such a state, a portion of the gate oxide film formed to a portion of a silicon substrate exposed to the stepped portion (within a range of a dotted circle A in FIG. 39) undergoes larger stress. Therefore, it is considered that the field effect transistor the gate electrode of which is formed on the gate oxide film GZ as shown in FIG. 38 and FIG. 39 loses the reliability of the gate oxide film GZ and, thus, the reliability as the field effect transistor is lost.

In the semiconductor device described above, an oxide film TO of a predetermined thickness is formed by applying the thermal oxidation process to the polysilicon film before patterning into a predetermined shape. Therefore, the total thickness of the stacked film comprising the oxide film TOA, the CVD oxide film ZF1, and the CVD oxide film ZF2 can be increased by controlling the thickness of the oxide film TO while restricting the thickness of the CVD oxide film ZF1. Thus, penetration of the impurity can be inhibited reliably while suppressing the amount of overetching upon patterning the CVD oxide film ZF1.

In this embodiment, the thickness of the oxide film TO is about 20 nm, the thickness of the CVD oxide film ZF1 is about 10 nm, and the thickness of the CVD oxide film ZF2 is about 70 nm, so that the total thickness of the implantation mask (oxide film TO+CVD oxide film ZF1+CVD oxide film ZF2) is 100 nm. When the projected penetration depth is determined under the same conditions as those described above, the projected penetration depth is about 100 nm (0.1 µm). Then, in relation with the amount of implantation included in the projected penetration depth and the total amount of injection, $BF_2$ at $8\times10^{10}$ cm$^{-2}$ is implanted through the implantation mask into the polysilicon film.

While a portion of $BF_2$ to be implanted into the polysilicon film is taken into a portion of the oxide film TO, if this is considered negligible, $BF_2$ in the polysilicon film is about $1\times10^{13}$ cm$^{-2}$. Then, the amount of $BF_2$ implanted through the implantation mask into the polysilicon film ($8\times10^{10}$ cm$^{-2}$) is 0.008 times the amount of $BF_2$ in the polysilicon film ($1\times10^{13}$ cm$^{-2}$) and it can be seen that the amount of $BF_2$ implanted through the implantation mask into the polysilicon film is at a substantially negligible level.

In addition, since the thickness of the CVD oxide film ZF1 can be suppressed by so much as the oxide film TO is formed as described above, lowering of the reliability of the gate oxide film caused by overetching of the CVD oxide film ZF1 can be suppressed.

Third Embodiment

In the second embodiment, the description has been made to a semiconductor device in which a thermal oxidation process is applied to the polysilicon film before patterning into the shape of the resistance element to form an oxide film TO in order to restrict the thickness of the CVD oxide film ZF1. However, by the application of the thermal oxidation process, the polysilicon film is thermally oxidized to vary the thickness. In order to confine the variation of the film thickness within an allowable range as the resistance value of the resistance element, the thermal oxidation is limited. An embodiment of a semiconductor device that adds a resist pattern to an implantation mask is to be described in a case where the thermal oxidation process is limited.

Figure 40:
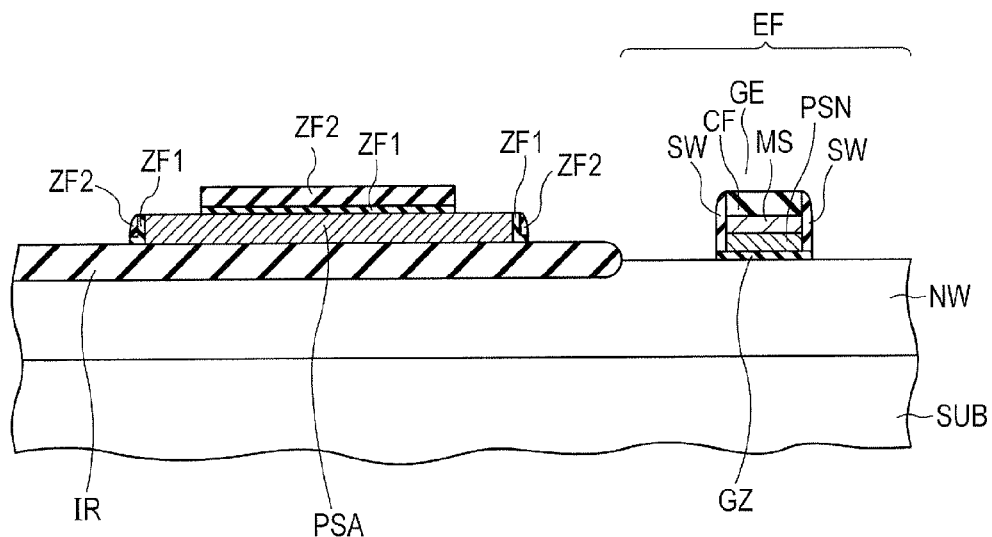
FIG. 40 is a cross sectional view showing a step of a method of manufacturing a semiconductor device according to a third embodiment of the invention.

After the steps identical with the steps shown in FIG. 1 to FIG. 13 (first embodiment 1) described above, the polysilicon film PSA is exposed at a portion in a region where a contact region is formed other than the respective portions of the CVD oxide film ZF1 and the CVD oxide film ZF2 covering the portion of the polysilicon film PSA that serves as the resistor main body as shown in FIG. 40.

Figure 41:
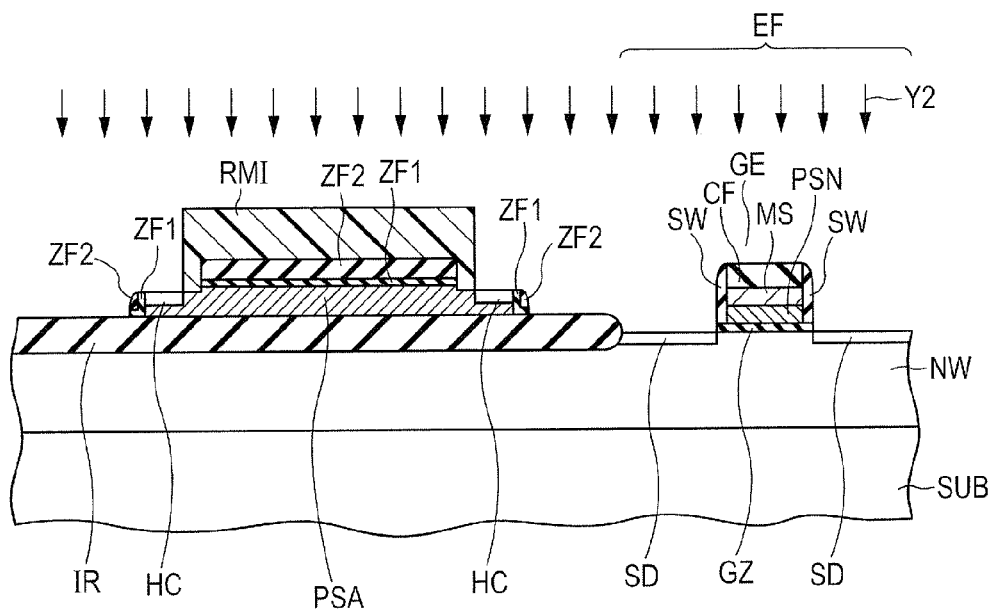
FIG. 41 is a cross sectional view showing a step succeeding to the step shown in FIG. 40 in the third embodiment.

Then, as shown in FIG. 41, a resist pattern RMI is formed by applying a predetermined photoengraving process. The resist pattern RMI is formed so as to cover the CVD oxide film ZF1 and the CVD oxide film ZF2 covering the polysilicon film PSA and expose a portion where the contact region is formed.

Then, P-type source/drain regions SD are formed in the element forming region EF by implanting, for example, $BF_2$ as a P-type impurity under predetermined implantation conditions (implantation energy: about 50 KeV, dosage: about $4 \times 10^{15}$ cm$^{-2}$) (shown by arrow Y2: implantation B). On the other hand, P-type high concentration regions HC are formed to the polysilicon film PSA. Since the portion of the polysilicon film PSA that serves as the resistor main body is covered by the resist pattern RMI in addition to the CVD oxide films ZF1 and ZF2, implantation of the impurity through the CVD oxide films ZF2 and ZF1 into the polysilicon film PSA is suppressed.

Figure 42:
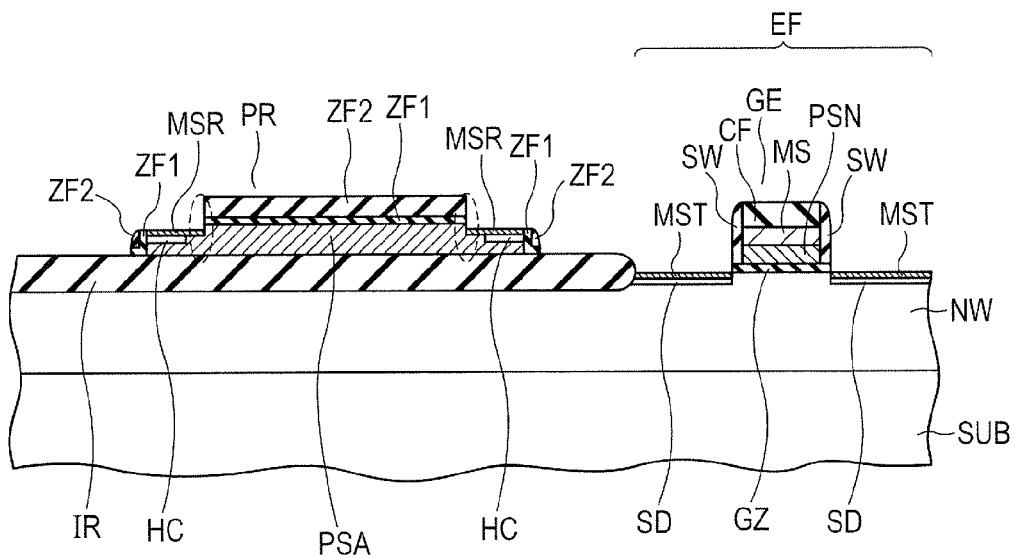
FIG. 42 is a cross sectional view showing a step succeeding to the step shown in FIG. 41 in the third embodiment.

Then, as shown in FIG. 42, a metal silicide film MSR such as a cobalt silicide film is formed on the surface of the polysilicon film PSA where silicon (Si) is exposed, and a metal silicide film MST is formed over the surface of the element forming region EF (surface of the source/drain region SD) by a salicide process.

Figure 43:
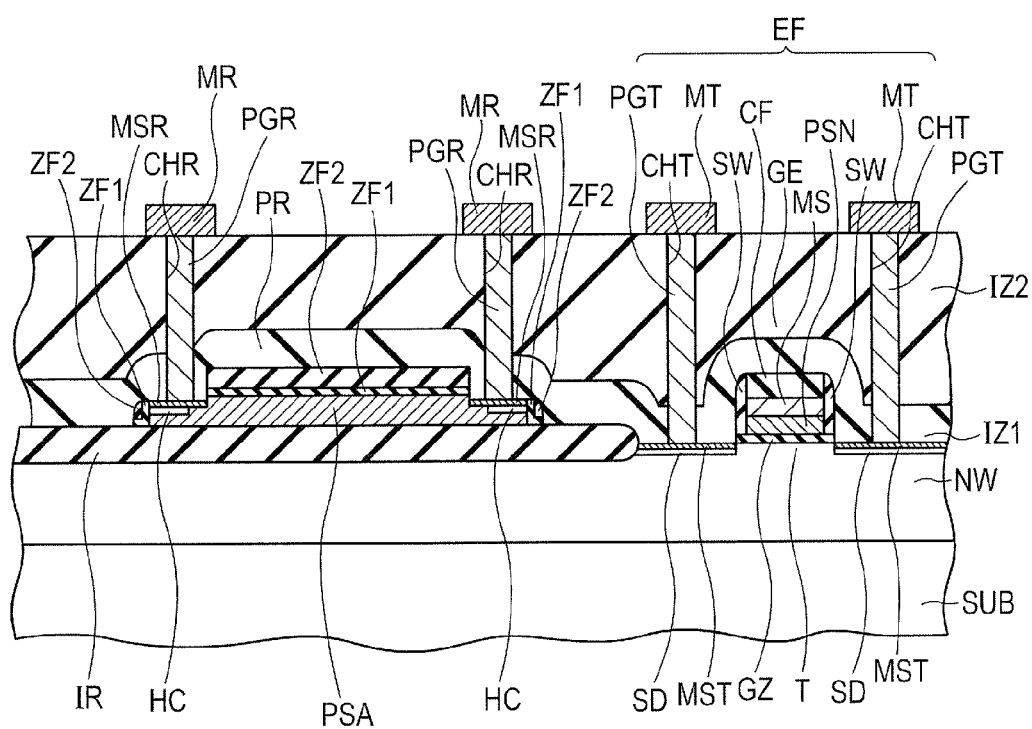
FIG. 43 is a cross sectional view showing a step succeeding to the step shown in FIG. 42 in the third embodiment, which is a cross sectional view showing a main portion of the semiconductor device.

Then, after steps identical with the steps shown in FIG. 17 to FIG. 19, a main portion of the semiconductor device is completed as shown in FIG. 43. Identical members with those of the semiconductor device shown in FIG. 19 carry the same reference numerals for which description is not repeated.

In the semiconductor device described above, penetration of the impurity through the CVD oxide film ZF1, etc. can be inhibited reliably upon implantation B due to the covering by the resist pattern RMI in addition to the CVD oxide films ZF1 and ZF2 as the implantation mask.

It is necessary that the resist pattern RMI covers the entire surface of the CVD oxide films ZF1 and ZF2. Therefore, the resist pattern RMI is formed in a planar pattern larger than the planar pattern of the CVD oxide films ZF1 and ZF2 considering the displacement of the mask.

Figure 44:
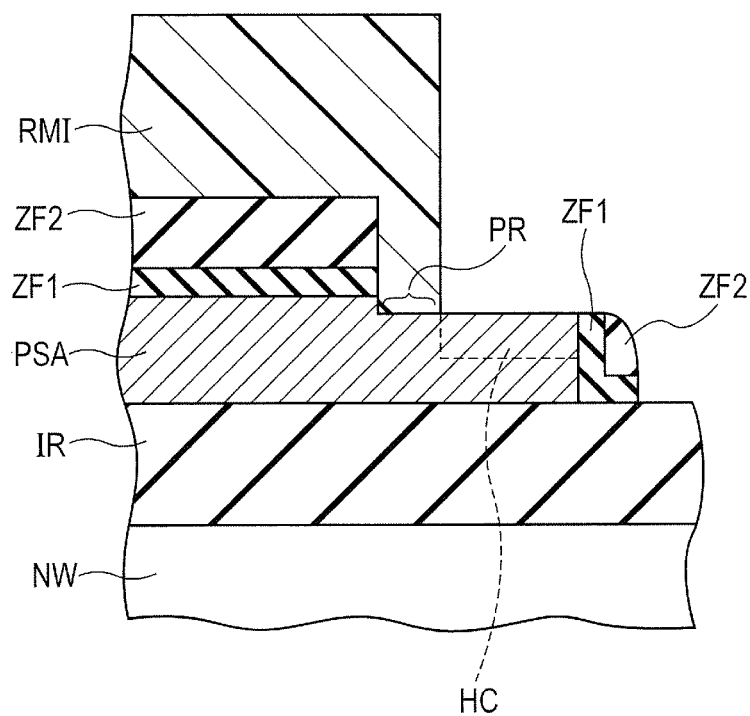
FIG. 44 is a fragmentary enlarged cross sectional view in the step shown in FIG. 41 for explaining the function and the effect in the third embodiment.

As shown in FIG. 44, the region where the high concentration region HC is formed is determined by the position of the resist pattern RMI. Depending on the positional displacement of the resist pattern RMI, a portion of the polysilicon film PSA situated between a portion where the high concentration region HC is formed and a portion of the polysilicon film PSA that serves as the resistor main body situated just below the CVD oxide films ZF1 and ZF2 (polysilicon film RR) becomes a resistance component.

Figure 45:
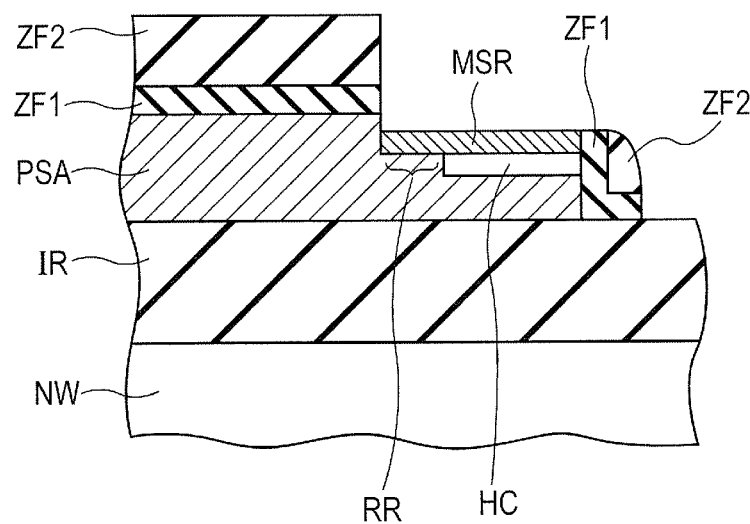
FIG. 45 is a fragmentary enlarged cross sectional view in the step shown in FIG. 42 for explaining the function and the effect in the third embodiment.

In the semiconductor device described above, a metal silicide film MSR is formed over the surface of the exposed polysilicon film RR and the high concentration region HC as shown in FIG. 45. The sheet resistance of the metal silicide film MSR is $10\Omega/\square$. On the other hand, the sheet resistance of the polysilicon film RR is about several hundreds $\Omega/\square$ to several $K\Omega/\square$. Accordingly, the sheet resistance of the metal silicide is lower than the sheet resistance of the polysilicon film RR.

It is considered that when the impurity concentration in the polysilicon film RR is lowered, the ohmic performance between the metal silicide film MSR and the polysilicon film RR is lowered to increase the boundary resistance. It is considered that the effect due to the increase in the resistance value is insignificant when the length of the polysilicon film RR is about 0.2 μm and the width as the resistor is about 2 μm. Further, the area of the metal silicide film MSR formed in the high concentration region HC is larger than the area of the metal silicide film MSR formed in the polysilicon film RR, and larger than the area of contact between the plug PG and the high concentration region HC.

Accordingly, the metal silicide film MSR is formed to the exposed polysilicon film PSA also including the high concentration region HC, and this can contribute to suppress the variation of the resistance value of the resistance element relative to the positional displacement of the resist pattern RMI.

Accordingly, in the semiconductor device described above, since the resist pattern RMI is formed in addition to the CVD oxide films ZF1 and ZF2 as the implantation mask in implantation B, penetration of the impurity through the implantation mask can be inhibited and variation of the resistance value due to the positional displacement upon forming the resist pattern RMI can also be suppressed.

Fourth Embodiment

A semiconductor device having a polysilicon resistor and a field effect transistor according to a fourth embodiment of the invention is to be described. At first a manufacturing method is to be described.

Figure 46:
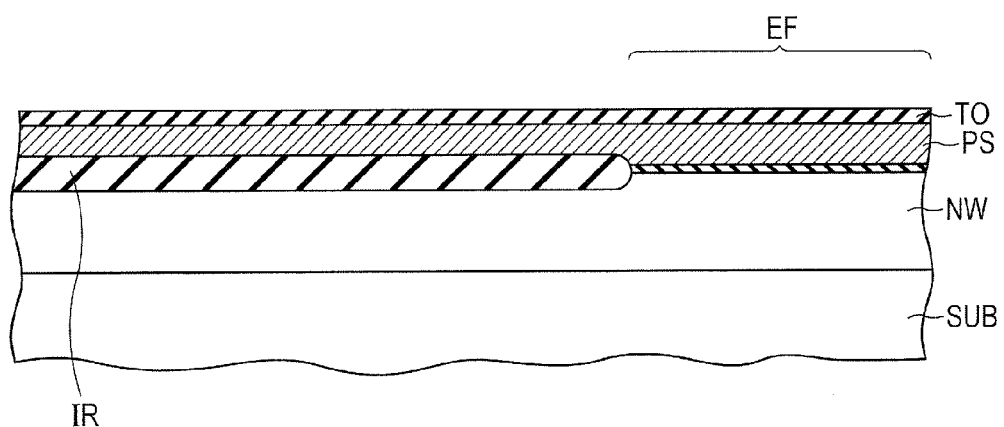
FIG. 46 is a cross sectional view showing a step of a method of manufacturing a semiconductor device according to a fourth embodiment of the invention.
Figure 47:
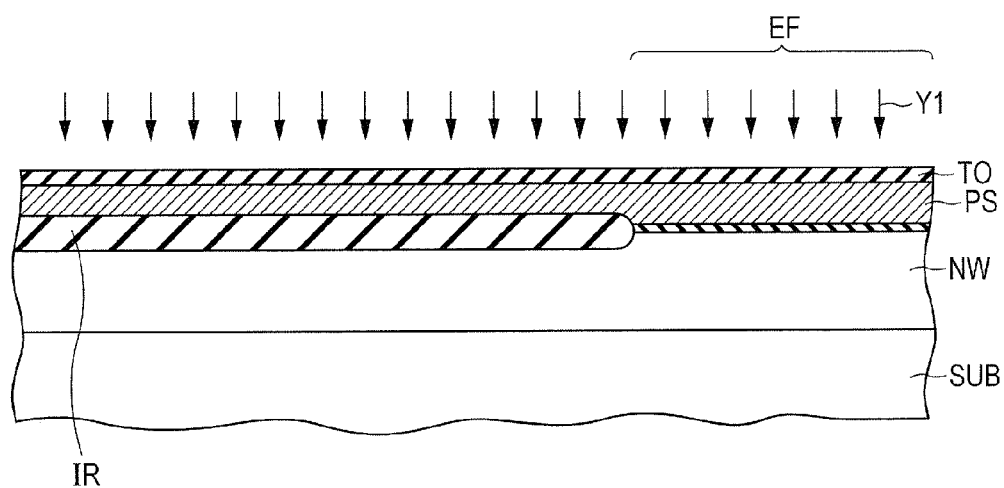
FIG. 47 is a cross sectional view showing a step succeeding to the step shown in FIG. 46 in the fourth embodiment.

At first, after a step identical with the step shown in FIG. 1, an oxide film (thermal oxide film) TO of about 20 nm thickness is formed over the surface of a polysilicon film PS by a thermal oxidation process as shown in FIG. 46. Then, a predetermined amount of impurity is implanted into the polysilicon film PS so as to have a desired resistance value as the resistance element. As shown in FIG. 47, $BF_2$ is implanted, for example, as a P-type impurity over the entire surface of the polysilicon film PS under predetermined implantation conditions (implantation energy: about 40 KeV, dosage: about $1 \times 10^{13}$ cm$^{-2}$) (shown by arrow Y1).

Figure 48:
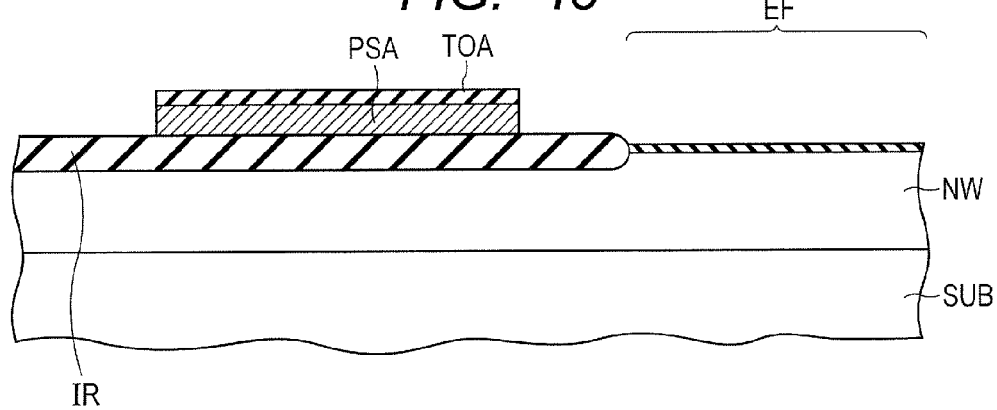
FIG. 48 is a cross sectional view showing a step succeeding to the step shown in FIG. 47 in the fourth embodiment.

Then, a resist pattern (not illustrated) for patterning the polysilicon film PS into a predetermined shape as a resistance element is formed by applying a predetermined photoengraving process. Then, the oxide film TO and the polysilicon film PS are etched by using the resist pattern as a mask. Thus, as shown in FIG. 48, a polysilicon film PSA that serves as a resistance element is formed over an element isolation insulating film IR. A patterned oxide film TOA is situated over the upper surface of the polysilicon film PSA.

Figure 49:
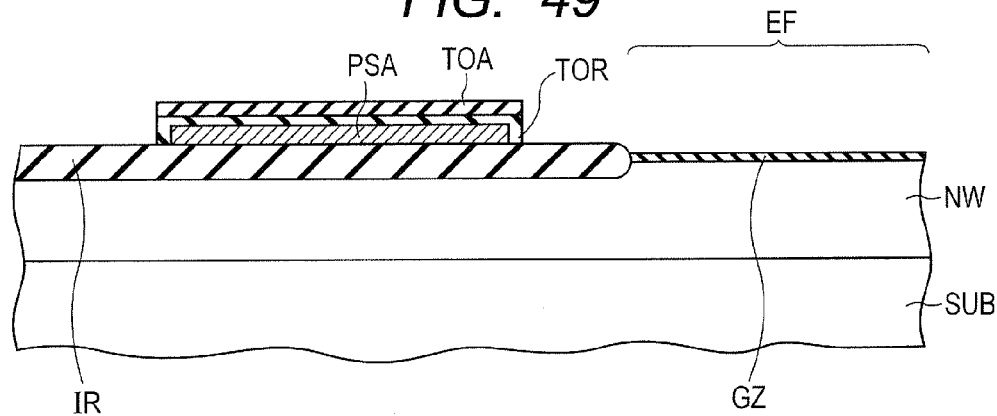
FIG. 49 is a cross sectional view showing a step succeeding to the step shown in FIG. 48 in the fourth embodiment.

Then, as shown in FIG. 49, a gate oxide film GZ of about 10 nm thickness is formed over an element forming region EF by applying a gate oxidation process (thermal oxidation process). In this step, in the polysilicon film PSA over the element isolation insulating film IR, the lateral side of the polysilicon film PSA is oxidized by thermal oxidation. In this step, oxidation proceeds also from the boundary between the oxide film TOA and the polysilicon film PSA to sometimes form an oxide film TOR. The thickness of the oxide film (oxide films TOA, TOR) situated over the upper surface of the polysilicon film PSA is larger than the oxide film (oxide film TOR) situated on the lateral side of the polysilicon film PSA.

Figure 50:
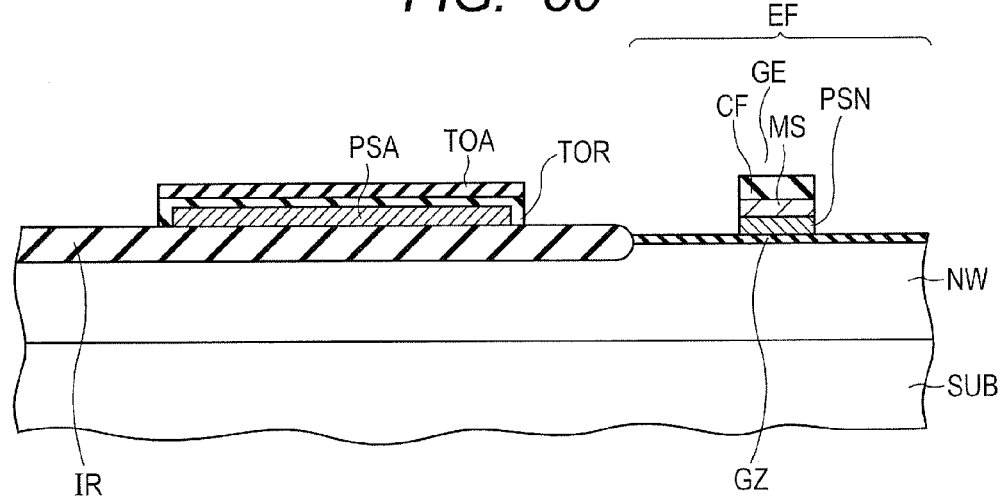
FIG. 50 is a cross sectional view showing a step succeeding to the step shown in FIG. 49 in the fourth embodiment.

Then, a gate electrode GE is formed in the element forming region EF as shown in FIG. 50 by way of the steps identical with the steps shown in FIG. 7 and FIG. 8. In the steps, since the polysilicon film PSA that serves as the resistance element is covered by the oxide films TOA and TOR, the polysilicon film PSA is not etched during patterning of the gate electrode GE.

Figure 51:
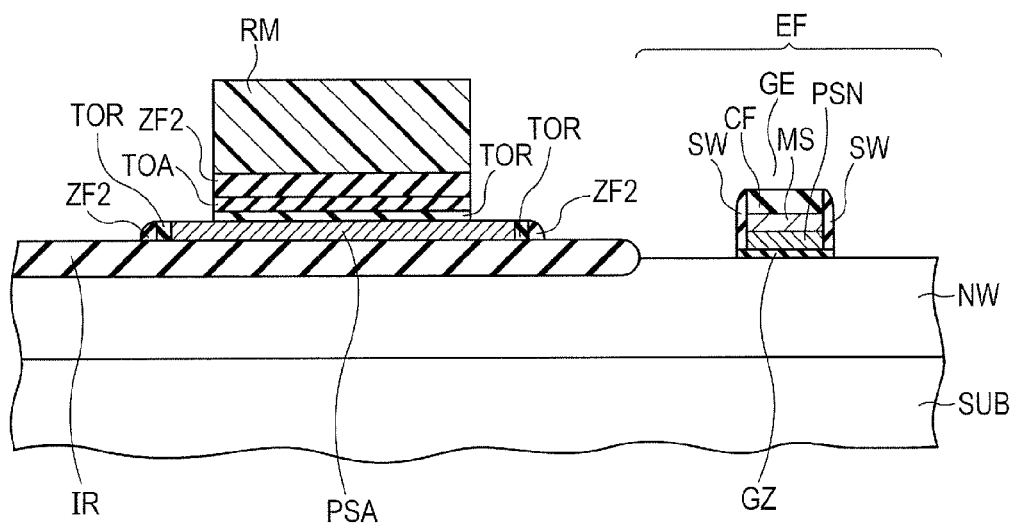
FIG. 51 is a cross sectional view showing a step succeeding to the step shown in FIG. 50 in the fourth embodiment.

Then, after a step identical with the step shown in FIG. 9, a side wall oxide film SW is formed on the side wall of the gate electrode GE by etching (dry etching) the exposed CVD oxide film ZF2 by using the resist pattern RM as a mask as shown in FIG. 51. On the other hand, over the polysilicon film PSA, portions of the oxide film TOR and TOA and the CVD oxide film ZF2 situated in the region where the contact region is formed are removed, leaving the respective portions of the oxide films TOR, TOA and the CVD oxide film ZF2 covering the portion of the polysilicon film PSA that serves as the resistor main body to expose the polysilicon film PSA.

Figure 52:
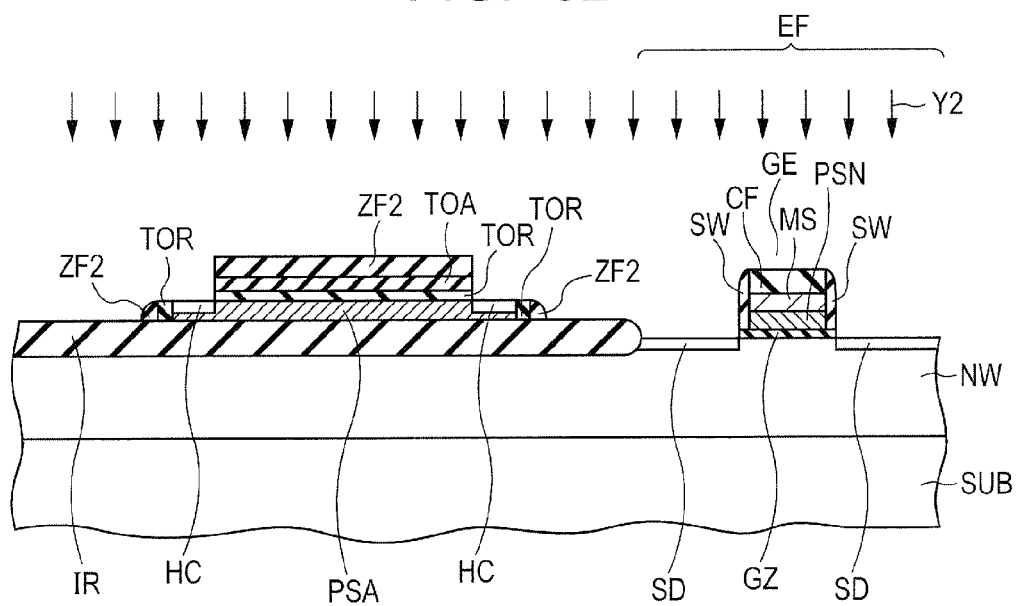
FIG. 52 is a cross sectional view showing a step succeeding to the step shown in FIG. 51 in the fourth embodiment.

Then, as shown in FIG. 52, P-type source/drain regions SD are formed in the element forming region EF by implanting, for example, $BF_2$ as a P-type impurity under predetermined implantation conditions (implantation energy: about 50 KeV, dosage: about $4\times10^{15}$ $cm^{-2}$) (arrow Y2: implantation B). On the other hand, in the polysilicon film PSA, P-type high concentration regions HC are formed. In this step, since the portion of the polysilicon film PSA that serves substantially as the resistance element is covered by a stacked film of a predetermined thickness comprising the oxide films TOR, TOA, and the CVD oxide film ZF2, implantation of the impurity through the stacked film (oxide film TOR, TOA, and CVD oxide film ZF2) into the polysilicon film PSA is suppressed.

Figure 53:
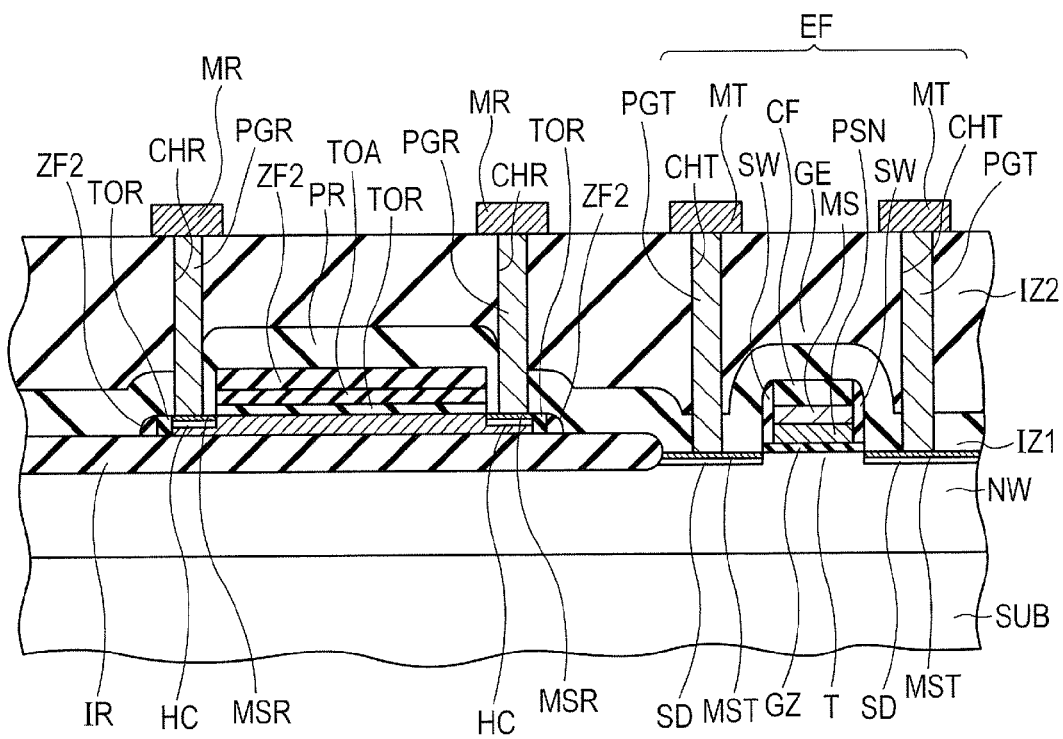
FIG. 53 is a cross sectional view showing a step succeeding to the step shown in FIG. 52 in the fourth embodiment, which is a cross sectional view showing a main portion of the semiconductor device.

Then, after steps identical with the steps shown in FIG. 16 to FIG. 19, a main portion of the semiconductor device is completed as shown in FIG. 53. Members identical with those of the semiconductor device shown in FIG. 19 carry the same reference numerals for which description is not repeated.

In the semiconductor device described above, the oxide films TOR and TOA are formed so as to cover the polysilicon film PSA by the thermal oxidation process without forming the CVD oxide film ZF1 patterned so as to cover the polysilicon film PSA. Accordingly, a mask for patterning the CVD oxide film ZF1 is not necessary.

Further, in the semiconductor device described above, since the oxide film TOR is formed in addition to the oxide film TOA over the upper surface of the polysilicon film PSA, penetration of the impurity through the implantation mask can be inhibited.

Fifth Embodiment

A pattern for arranging the resistance element and the pattern for arranging the metal interconnect applied to the semiconductor device in each of the embodiments are to be described.

FIRST EXAMPLE

Figure 54:
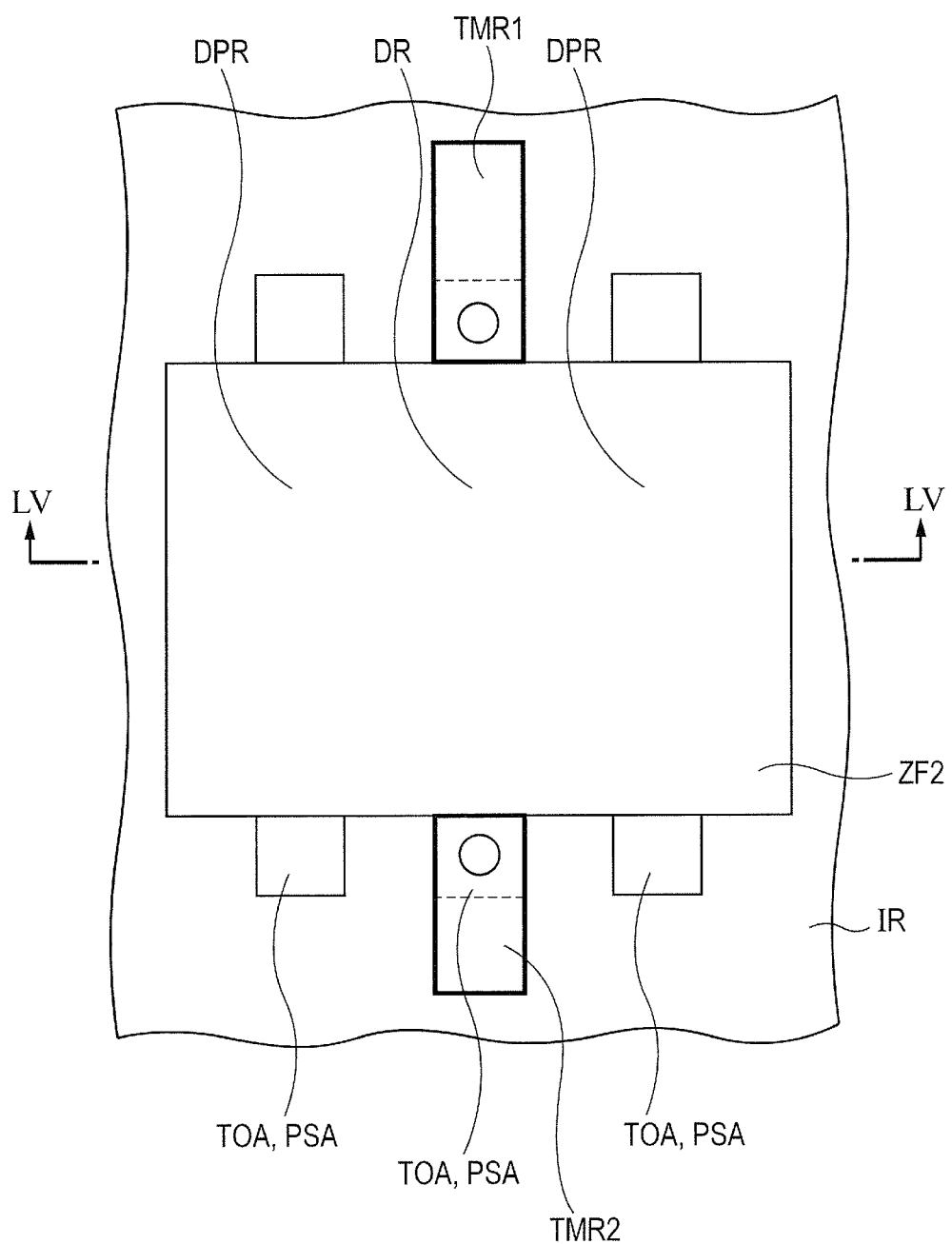
FIG. 54 is a plan view showing a first example of an arrangement pattern of a polysilicon resistor in a semiconductor device according to a fifth embodiment of the invention.
Figure 55:
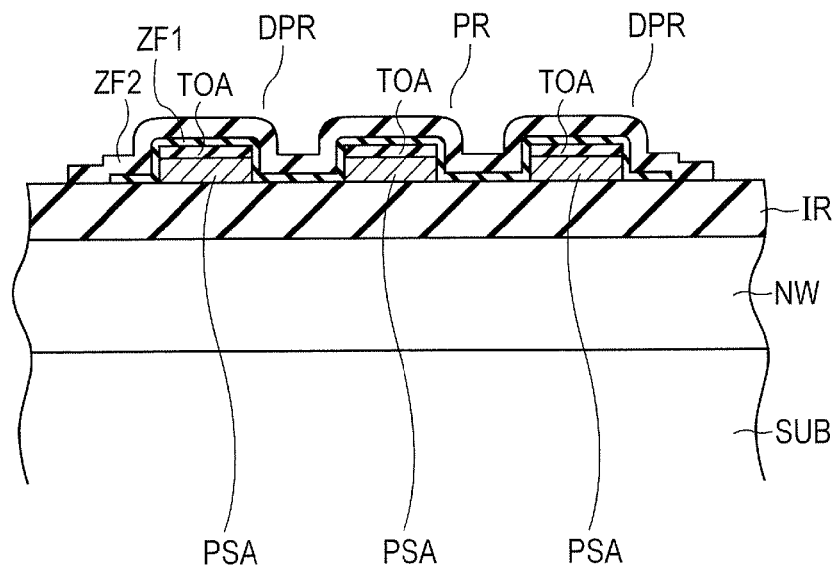
FIG. 55 is a cross sectional view along a cross sectional line LV-LV shown in FIG. 54 in the fifth embodiment.

At first, description is to be made to a case where the semiconductor device has the resistance element (polysilicon resistor). In this case, dummy polysilicon resistors DPR are arranged so as to put an actual polysilicon resistor PR therebetween as a pattern for arranging the polysilicon resistor as shown in FIGS. 54 and 55.

Comparing a case where one polysilicon resistor PR is formed as an isolated pattern and a case where a plurality of polysilicon resistors are formed each at a predetermined distance, a patterning accuracy in the latter is improved to attain a finished state closer to a designed pattern. Therefore, in a case of one polysilicon resistor, a polysilicon resistor PR of higher accuracy (in view of shape and resistance value) is obtained by arranging dummy polysilicon resistors DPR so as to put the polysilicon resistor therebetween at a predetermined distance. As a leading interconnect, a metal interconnect TMR1 is electrically connected to one contact region of the polysilicon resistor PR, and a metal interconnect TMR2 is electrically connected to the other contact region.

SECOND EXAMPLE

Figure 56:
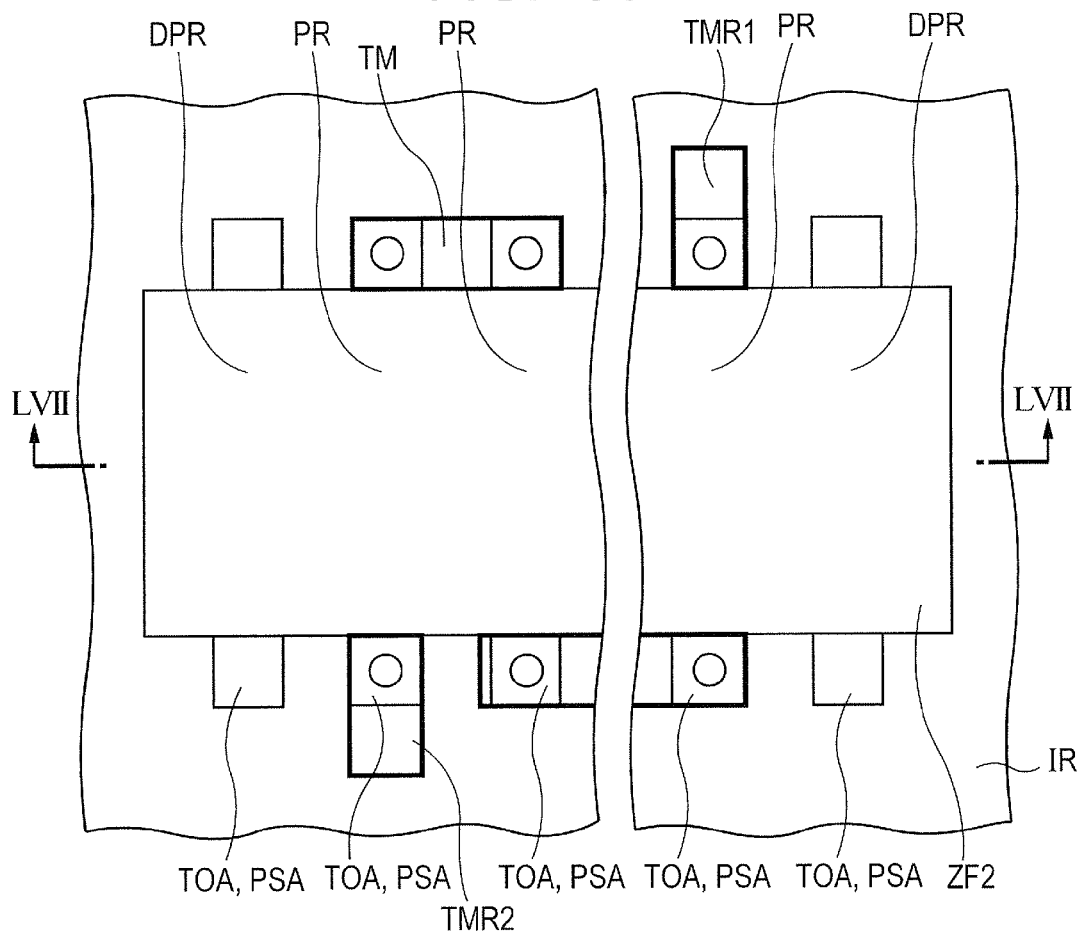
FIG. 56 is a plan view showing a second example of an arrangement pattern of the polysilicon resistor in the fifth embodiment.
Figure 57:
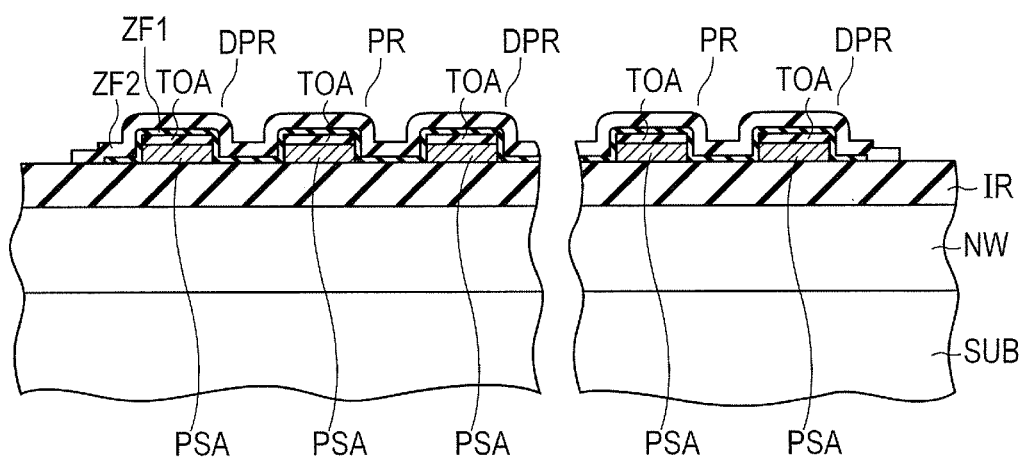
FIG. 57 is a cross sectional view along a cross sectional line of LVII-LVII shown in FIG. 56 in the fifth embodiment.

Description is to be made to a case where the semiconductor device has a plurality of resistance elements (polysilicon resistors). In this case, as shown in FIG. 56 and FIG. 57, dummy polysilicon resistors DPR are arranged so as to put each of the series of plural polysilicon resistors PR between each of adjacent dummy resistors as a pattern for arranging the polysilicon resistor.

When a plurality of the polysilicon resistors are arranged, it is particularly necessary to ensure the patterning accuracy of the polysilicon resistors situated on both ends. For this purpose, a dummy polysilicon resistor is disposed to a polysilicon resistor situated at one end, and a dummy polysilicon resistor is disposed to a polysilicon resistor situated at the other end. Actual polysilicon resistors PR are arranged being spaced from each other by a predetermined distance and they are electrically connected in series by means of interconnects MR. As leading interconnects, a metal interconnect TMR1 is electrically connected in the contact region of the polysilicon resistor situated at one end, and a metal interconnect TMR2 is electrically connected in the contact region of the polysilicon resistor PR situated at the other end.

When a plurality of the polysilicon resistors PR are arranged, the CVD oxide films ZF1 and ZF2 that serve as the implantation mask upon performing implantation B are patterned so as to entirely cover the series of polysilicon resistors PR and DPR continuously including the dummy polysilicon resistor DPR, so that the space can be saved when compared with a case of patterning the CVD oxide films ZF1 and ZF2 on each of the polysilicon resistors. This can save the area for the layout and can contribute to the reduction in the size of the semiconductor device.

In each of the semiconductor devices described above, while the element isolation insulating film has been described with respect to a field oxide film as an example, the element isolation insulating film is not restricted to the field oxide film but may be, for example, a trench isolation oxide film. Further, conditions for the implantation and numerical values of the film thickness, etc. in the embodiments are shown as examples and they are not limitative.

Preferred embodiments described herein are examples and the invention is not restricted to them. The present invention is defined not by the range described so far but by the scope of the claim. It is intended that the invention include all modifications or changes in the meaning and the range equivalent with those of the scope of the claims.

The present invention is utilized effectively to semiconductor devices having a polysilicon resistor and a field effect transistor.

What is claimed is:

1. A semiconductor device comprising, in the main surface of a semiconductor substrate:
    an element isolation insulating film formed in a predetermined region;
    an element forming region defined by the element isolation insulating film;
    a field effect transistor including a pair of source/drain regions and a gate electrode formed in the element forming region;
    a resistance element situated over the element isolation insulating film formed of a polysilicon film, and having a resistor main body having a predetermined impurity concentration and a contact region; and
    a shielding film covering at least the resistor main body and comprising a first insulating film and a second insulating film formed over the first insulating film,
    wherein the first insulating film of the shielding film has:
    a first portion situated on the lateral side of the polysilicon film of the resistance element; and a second portion extending from the lateral side in a direction apart from the lateral side along the upper surface of the element isolation insulating film, wherein the second insulating film of the shielding film is situated so as to cover the first portion and the second portion of the first insulating film, and wherein the field effect transistor comprises a side wall insulating film formed of a layer identical with that of the second insulating film, directly contacting a side wall of the gate electrode.

2. The semiconductor device according to claim 1, wherein the shielding film comprises a third insulating film interposed between the resistor main body and the first insulating film.

3. The semiconductor device according to claim 1 or 2, wherein a high concentration region of a higher impurity concentration than the predetermined impurity concentration is formed in the contact region.

4. The semiconductor device according to claim 1 or 2,
wherein a first metal silicide film is formed in the contact region, and wherein a second metal silicide film is formed over the surface of the pair of source/drain regions in the element forming region.

5. The semiconductor device according to claim 1 or 2, wherein the thickness of the portion of the polysilicon film situated in the contact region is less than the thickness of the portion of the polysilicon film situated to the resister main body.

* * * * *